(12) United States Patent
Awano

(10) Patent No.: US 12,144,119 B2
(45) Date of Patent: Nov. 12, 2024

(54) PARTS REPLENISHMENT SYSTEM AND PARTS REPLENISHMENT METHOD

(71) Applicant: YAMAHA HATSUDOKI KABUSHIKI KAISHA, Iwata (JP)

(72) Inventor: Yukinari Awano, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 361 days.

(21) Appl. No.: 17/295,307

(22) PCT Filed: Nov. 20, 2018

(86) PCT No.: PCT/JP2018/042796
§ 371 (c)(1),
(2) Date: May 19, 2021

(87) PCT Pub. No.: WO2020/105112
PCT Pub. Date: May 28, 2020

(65) Prior Publication Data
US 2022/0015278 A1   Jan. 13, 2022

(51) Int. Cl.
*H05K 13/08*   (2006.01)
(52) U.S. Cl.
CPC ......... *H05K 13/086* (2018.08); *H05K 13/087* (2018.08); *H05K 13/0882* (2018.08)
(58) Field of Classification Search
CPC . H05K 13/086; H05K 13/087; H05K 13/0882
See application file for complete search history.

(56) References Cited

U.S. PATENT DOCUMENTS

| 5,231,585 | A | * | 7/1993 | Kobayashi | G06Q 10/06 700/115 |
| 5,329,690 | A | * | 7/1994 | Tsuji | H05K 13/086 29/430 |

(Continued)

FOREIGN PATENT DOCUMENTS

| CN | 102348368 A * | 2/2012 |
| CN | 202586151 U | 12/2012 |

(Continued)

OTHER PUBLICATIONS

An Office Action mailed by China National Intellectual Property Administration on Feb. 25, 2022, which corresponds to Chinese Patent Application No. 201880099596.1 and is related to U.S. Appl. No. 17/295,307 with English language translation.

(Continued)

*Primary Examiner* — Jeffrey T Carley
(74) *Attorney, Agent, or Firm* — Studebaker & Brackett PC

(57) ABSTRACT

A parts replenishment system configured to replenish a parts supply device attached to a parts mounting device with parts includes an instruction device configured to issue an instruction to unload the parts from a storage. The parts replenishment system further includes a presentation device configured to present preprocessing identification information for identifying preprocessing, which is processing on a packaging material for the parts for which an unloading instruction has been issued by the instruction device before replenishment of the parts supply device with the parts.

18 Claims, 14 Drawing Sheets

(56) References Cited

U.S. PATENT DOCUMENTS

| | | | | |
|---|---|---|---|---|
| 6,002,650 | A * | 12/1999 | Kuribayashi | G05B 19/4097 700/121 |
| 9,820,420 | B2 * | 11/2017 | Ohyama | H05K 13/0417 |
| 2003/0131468 | A1 * | 7/2003 | Yasuda | H05K 13/0882 700/95 |
| 2012/0266457 | A1 * | 10/2012 | Hanamura | H05K 13/0434 312/223.1 |
| 2013/0326867 | A1 * | 12/2013 | Uesugi | H05K 13/0419 221/9 |
| 2014/0150254 | A1 * | 6/2014 | Kasuga | H05K 13/021 29/832 |
| 2015/0189801 | A1 * | 7/2015 | Yanagida | H05K 13/02 221/25 |
| 2016/0185093 | A1 | 6/2016 | Ohashi et al. | |
| 2016/0231727 | A1 * | 8/2016 | Sagara | H05K 13/0857 |
| 2016/0353621 | A1 * | 12/2016 | Maezono | H05K 13/0417 |
| 2017/0164530 | A1 * | 6/2017 | Yasuhira | H05K 13/0419 |
| 2018/0049353 | A1 * | 2/2018 | Michizoe | H05K 13/0419 |
| 2018/0118387 | A1 | 5/2018 | Eguchi et al. | |
| 2018/0220560 | A1 * | 8/2018 | Otsuka | H05K 13/0452 |
| 2019/0045680 | A1 * | 2/2019 | Kondo | H05K 13/021 |
| 2019/0313557 | A1 * | 10/2019 | Matsushita | H05K 13/082 |

FOREIGN PATENT DOCUMENTS

| | | | | |
|---|---|---|---|---|
| CN | 105519250 | A | | 4/2016 |
| CN | 107926147 | A | | 4/2018 |
| EP | 1239720 | A2 * | 9/2002 | H05K 13/0417 |
| EP | 3833173 | A1 * | 6/2021 | H05K 13/021 |
| JP | 2000-022392 | A | | 1/2000 |
| JP | 2003-110296 | A | | 4/2003 |
| JP | 2004-039881 | A | | 2/2004 |
| JP | 2008-066404 | A | | 3/2008 |
| JP | 2008-311393 | A | | 12/2008 |
| JP | 2009-049437 | A | | 3/2009 |
| JP | 2012-142519 | A | | 7/2012 |
| JP | 2014-075423 | A | | 4/2014 |
| JP | 2016-036003 | A | | 3/2016 |
| JP | 5913047 | B2 | | 4/2016 |
| JP | 2017-224721 | A | | 12/2017 |
| JP | 2018-073966 | A | | 5/2018 |
| JP | 2018-164018 | A | | 10/2018 |
| KR | 10-2016-0091163 | A | | 8/2016 |
| WO | WO-9727522 | A1 * | 7/1997 | G05B 19/4097 |
| WO | 2014/174643 | A1 | | 10/2014 |
| WO | 2016/002010 | A1 | | 1/2016 |
| WO | 2017/085816 | A1 | | 5/2017 |
| WO | 2017/109892 | A1 | | 6/2017 |
| WO | 2017/221327 | A1 | | 12/2017 |
| WO | 2018/135446 | A1 | | 7/2018 |

OTHER PUBLICATIONS

An Office Action; "Notice of Reasons for Refusal," mailed by the Japanese Patent Office on Apr. 5, 2022, which corresponds to Japanese Patent Application No. 2020-557060 and is related to U.S. Appl. No. 17/295,307 with English language translation.

International Search Report issued in PCT/JP2018/042796; mailed Feb. 12, 2019.

Written Opinion issued in PCT/JP2018/042796; mailed Feb. 12, 2019.

An Office Action mailed by China National Intellectual Property Administration on Sep. 26, 2022, which corresponds to Chinese Patent Application No. 201880099596.1 and is related to U.S. Appl. No. 17/295,307.

* cited by examiner

FIG. 2A  DEVICE INFORMATION

| LINE | LINE 1 | | |
|---|---|---|---|
| MACHINE NO. | MOUNTER 1 | | |
| BOARD DATA NAME | PCB_Program1 | | |
| ⟨PARTS-RELATED INFORMATION⟩ | PARTS NAME | SET POSITION | REMAINING NUMBER |
| PARTS INFORMATION 1 | Parts_1 | SetNo. 1 | 10/5000 |
| PARTS INFORMATION 2 | Parts_2 | SetNo. 2 | 30/5000 |
| PARTS INFORMATION 3 | Parts_3 | SetNo. 3 | 0/5000 |
| ... | | | |
| ⟨FEEDER-RELATED INFORMATION⟩ | SUPPLY DEVICE | SET POSITION | SETUP STATE |
| FEEDER INFORMATION 1 | TYPE A AUTOLOAD-TYPE FEEDER A | SetNo. 1 | COMPLETED |
| FEEDER INFORMATION 2 | TYPE B AUTOLOAD-TYPE FEEDER B | SetNo. 2 | COMPLETED |
| FEEDER INFORMATION 3 | TYPE C PEELING AND WINDING-TYPE FEEDER | SetNo. 3 | INCOMPLETED |
| ... | | | |

FIG. 2B  REPLENISHMENT REQUEST

| ⟨PARTS-RELATED INFORMATION⟩ | PARTS NAME | SUPPLY DEVICE | LOCATION | FEEDER SETUP STATE |
|---|---|---|---|---|
| REPLENISHMENT REQUEST 1 | Parts_1 | TYPE A AUTOLOAD-TYPE FEEDER A | LINE 1, MACHINE 1, SetNo. 1 | COMPLETED |
| REPLENISHMENT REQUEST 2 | Parts_2 | TYPE B AUTOLOAD-TYPE FEEDER B | LINE 1, MACHINE 1, SetNo. 2 | COMPLETED |
| REPLENISHMENT REQUEST 3 | Parts_3 | TYPE C PEELING AND WINDING-TYPE FEEDER | LINE 1, MACHINE 1, SetNo. 3 | INCOMPLETED |
| ... | | | | |

FIG. 2C  UNLOADING INSTRUCTION STORAGE

| ⟨PARTS-RELATED INFORMATION⟩ | PARTS NAME | PARTS PROCESSING INSTRUCTION | LOCATION |
|---|---|---|---|
| UNLOADING INSTRUCTION 1 | Parts_1 | TYPE A | LINE 1, MACHINE 1, SetNo. 1 |
| UNLOADING INSTRUCTION 2 | Parts_2 | TYPE B | LINE 1, MACHINE 1, SetNo. 2 |

MOBILE TERMINAL

| ⟨PARTS-RELATED INFORMATION⟩ | PARTS NAME | PARTS PROCESSING INSTRUCTION | LOCATION |
|---|---|---|---|
| UNLOADING INSTRUCTION 3 | Parts_3 | TYPE C + FEEDER ATTACHMENT | LINE 1, MACHINE 1, SetNo. 3 |

BEFORE CUTTING PROCESSING (PREPROCESSING)

AFTER CUTTING PROCESSING (PREPROCESSING)

AFTER BENDING PROCESSING (PREPROCESSING)

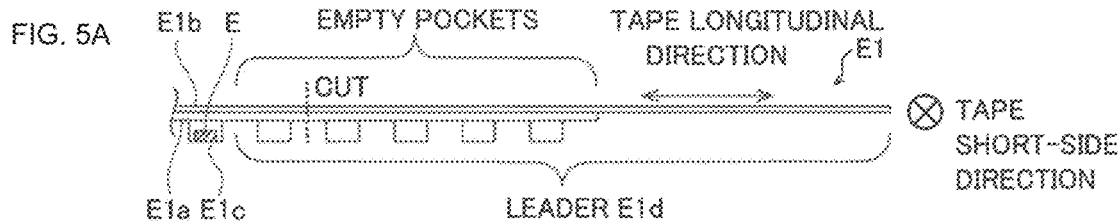
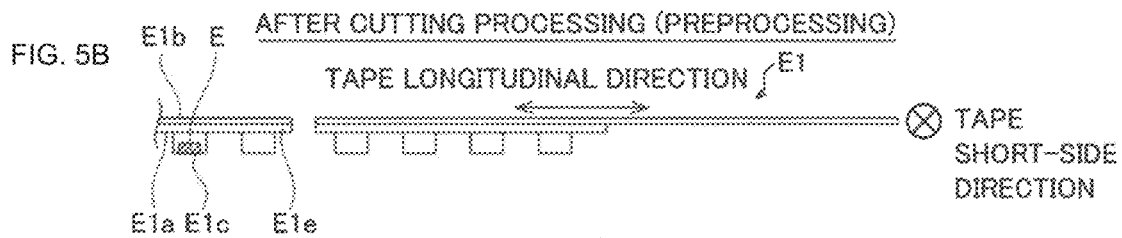
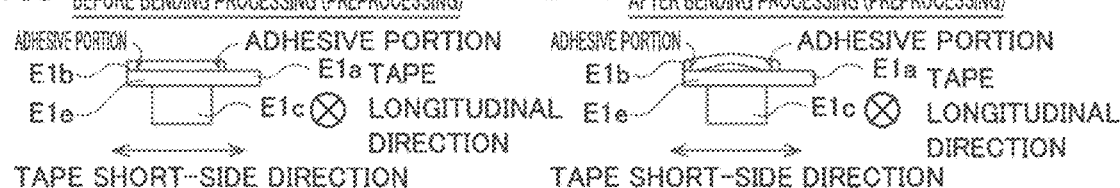
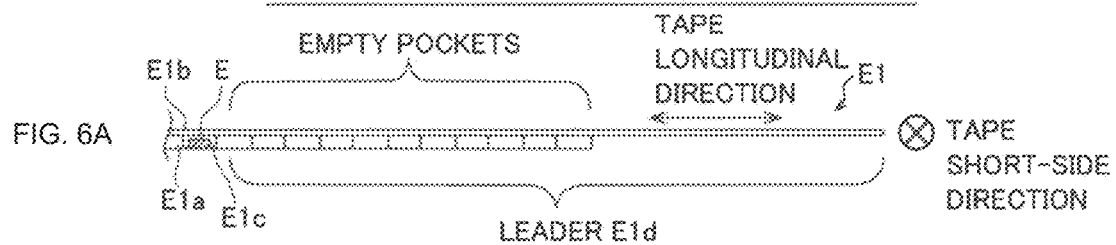
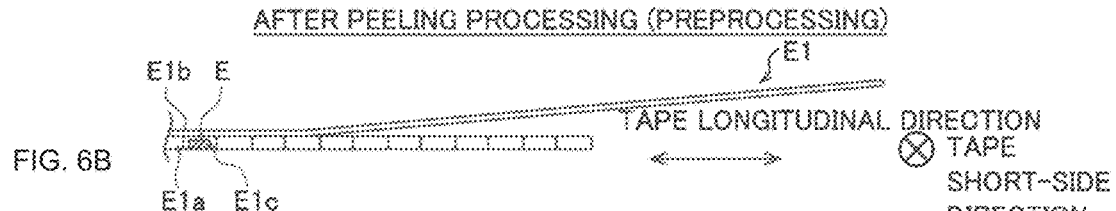
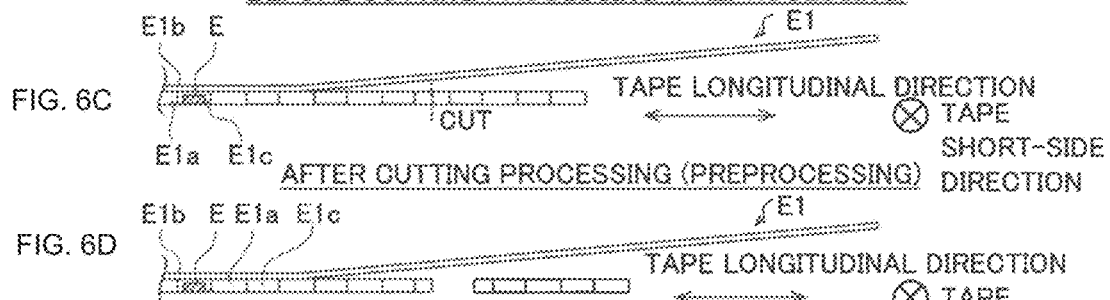
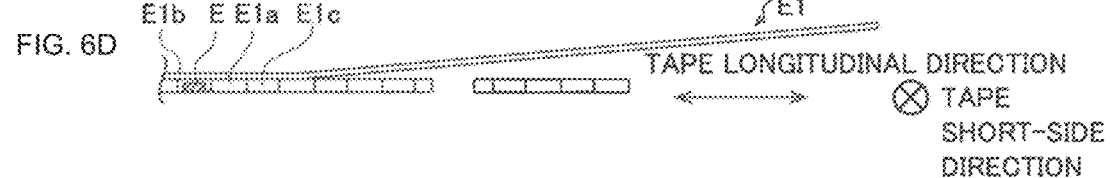

PARTS PROCESSING INSTRUCTION
UNLOADING STAGE A
PROCESS PARTS WITH JIG FOR PREPROCESSING A
PARTS NAME: Parts_1

PARTS PROCESSING INSTRUCTION
UNLOADING STAGE C
PROCESS PARTS WITH JIG FOR PREPROCESSING C
PARTS NAME: Parts_3
PARTS SUPPLY DEVICE
TYPE C PEELING AND WINDING-TYPE FEEDER

FIG. 9

PREPROCESSING SELECTION INFORMATION

| TYPE | FEEDER TYPE | | | TYPE OF PARTS | | PREPROCESSING |
|---|---|---|---|---|---|---|
| | SUPPLY METHOD | APPLICABLE TAPE WIDTH | APPLICABLE CARRIER TAPE | PARTS SIZE | TAPE TYPE | PARTS SIZE | |
| TYPE A-1 | AUTOLOAD METHOD | 8 mm WIDTH | FOR PAPER TAPE | FOR 1005 CHIP | PAPER TAPE | 1005 CHIP | PREPROCESSING A |
| TYPE A-2 | AUTOLOAD METHOD | 8 mm WIDTH | FOR PAPER TAPE | FOR 1608 CHIP | PAPER TAPE | 1608 CHIP | PREPROCESSING A |
| TYPE A-3 | AUTOLOAD METHOD | 8 mm WIDTH | FOR PAPER TAPE | FOR 2012 CHIP | PAPER TAPE | 2012 CHIP | PREPROCESSING A |
| TYPE A-4 | AUTOLOAD METHOD | 8 mm WIDTH | FOR PAPER TAPE | FOR 3216 CHIP | PAPER TAPE | 3216 CHIP | PREPROCESSING B |
| TYPE B-1 | AUTOLOAD METHOD | 8 mm WIDTH | FOR EMBOSSED TAPE | FOR 1005 CHIP | EMBOSSED TAPE | 1005 CHIP | PREPROCESSING B |
| TYPE B-2 | AUTOLOAD METHOD | 8 mm WIDTH | FOR EMBOSSED TAPE | FOR 1608 CHIP | EMBOSSED TAPE | 1608 CHIP | PREPROCESSING B |
| TYPE B-3 | AUTOLOAD METHOD | 8 mm WIDTH | FOR EMBOSSED TAPE | FOR 2012 CHIP | EMBOSSED TAPE | 2012 CHIP | PREPROCESSING B |
| TYPE B-4 | AUTOLOAD METHOD | 8 mm WIDTH | FOR EMBOSSED TAPE | FOR 3216 CHIP | EMBOSSED TAPE | 3216 CHIP | PREPROCESSING B |
| TYPE D-1 | AUTOLOAD METHOD | 12 mm WIDTH | FOR EMBOSSED TAPE | FOR □ 3 mm TO □ 5 mm | EMBOSSED TAPE | □ 3 mm TO □ 5 mm | PREPROCESSING D |
| TYPE D-2 | AUTOLOAD METHOD | 12 mm WIDTH | FOR EMBOSSED TAPE | FOR □ 5 mm TO □ 8 mm | EMBOSSED TAPE | □ 5 mm TO □ 8 mm | PREPROCESSING D |
| TYPE D-3 | AUTOLOAD METHOD | 16 mm WIDTH | FOR EMBOSSED TAPE | FOR □ 8 mm TO □ 10 mm | EMBOSSED TAPE | □ 8 mm TO □ 10 mm | PREPROCESSING D |
| TYPE D-4 | AUTOLOAD METHOD | 16 mm WIDTH | FOR EMBOSSED TAPE | FOR □ 10 mm TO □ 12 mm | EMBOSSED TAPE | □ 10 mm TO □ 12 mm | PREPROCESSING D |
| TYPE E-1 | AUTOLOAD METHOD | 24 mm WIDTH | FOR EMBOSSED TAPE | FOR □ 12 mm TO □ 15 mm | EMBOSSED TAPE | □ 12 mm TO □ 15 mm | PREPROCESSING E |
| TYPE E-2 | AUTOLOAD METHOD | 24 mm WIDTH | FOR EMBOSSED TAPE | FOR □ 15 mm TO □ 20 mm | EMBOSSED TAPE | □ 15 mm TO □ 20 mm | PREPROCESSING E |
| ... | ... | ... | ... | ... | ... | ... | ... |
| TYPE C | PEELING AND WINDING METHOD | 8 mm WIDTH | FOR PAPER & EMBOSSED TAPES | FOR □ 0.2 mm TO □ 3 mm | PAPER OR EMBOSS | □ 0.2 mm TO □ 3 mm | PREPROCESSING C |
| TYPE C | PEELING AND WINDING METHOD | 12 mm WIDTH | FOR PAPER & EMBOSSED TAPES | FOR □ 3 mm TO □ 5 mm | EMBOSSED TAPE | □ 3 mm TO □ 5 mm | PREPROCESSING C |
| TYPE C | PEELING AND WINDING METHOD | 16 mm WIDTH | FOR PAPER & EMBOSSED TAPES | FOR □ 5 mm TO □ 8 mm | EMBOSSED TAPE | □ 5 mm TO □ 8 mm | PREPROCESSING C |
| TYPE C | PEELING AND WINDING METHOD | 24 mm WIDTH | FOR PAPER & EMBOSSED TAPES | FOR □ 15 mm TO □ 20 mm | EMBOSSED TAPE | □ 15 mm TO □ 20 mm | PREPROCESSING C |
| ... | ... | ... | ... | ... | ... | ... | ... |

*FIG.10*

| PARTS NAME | PARTS SIZE | USABLE FEEDER |
|---|---|---|
| PARTS 1 | 1005 | TYPE A-1 OR TYPE C |
| PARTS 2 | 1608 | TYPE B-1 OR TYPE C |
| PARTS 3 | □1mm | TYPE C |
| PARTS 4 | □3.5mm | TYPE D-1 |
| ... | ... | ... |

PARTS PROCESSING INSTRUCTION
SELECT FEEDER TYPE B OR C

WHEN TYPE B IS SELECTED,
PERFORM PREPROCESSING B
WHEN TYPE C IS SELECTED,
PERFORM PREPROCESSING C

PARTS REPLENISHMENT PROCESSING

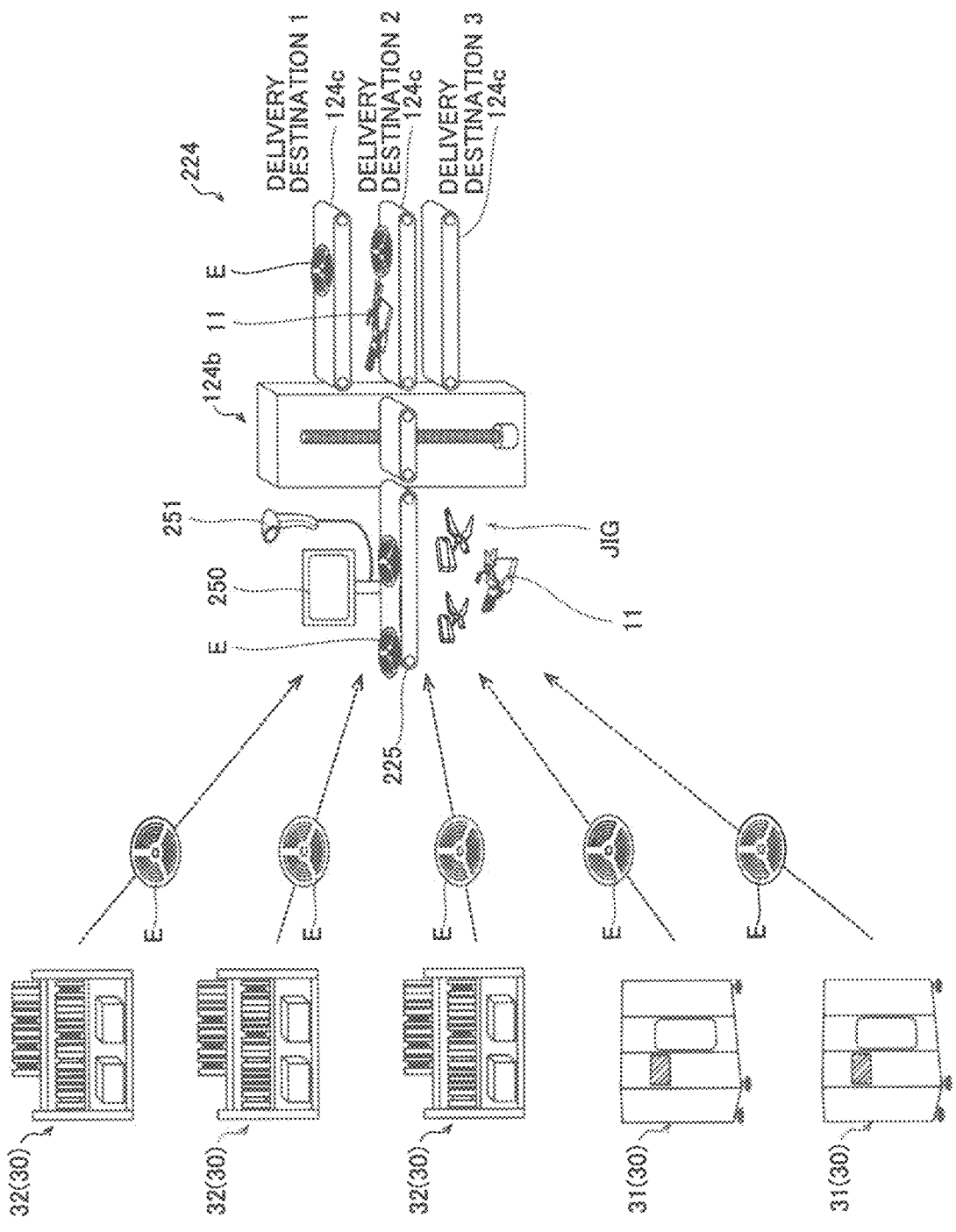

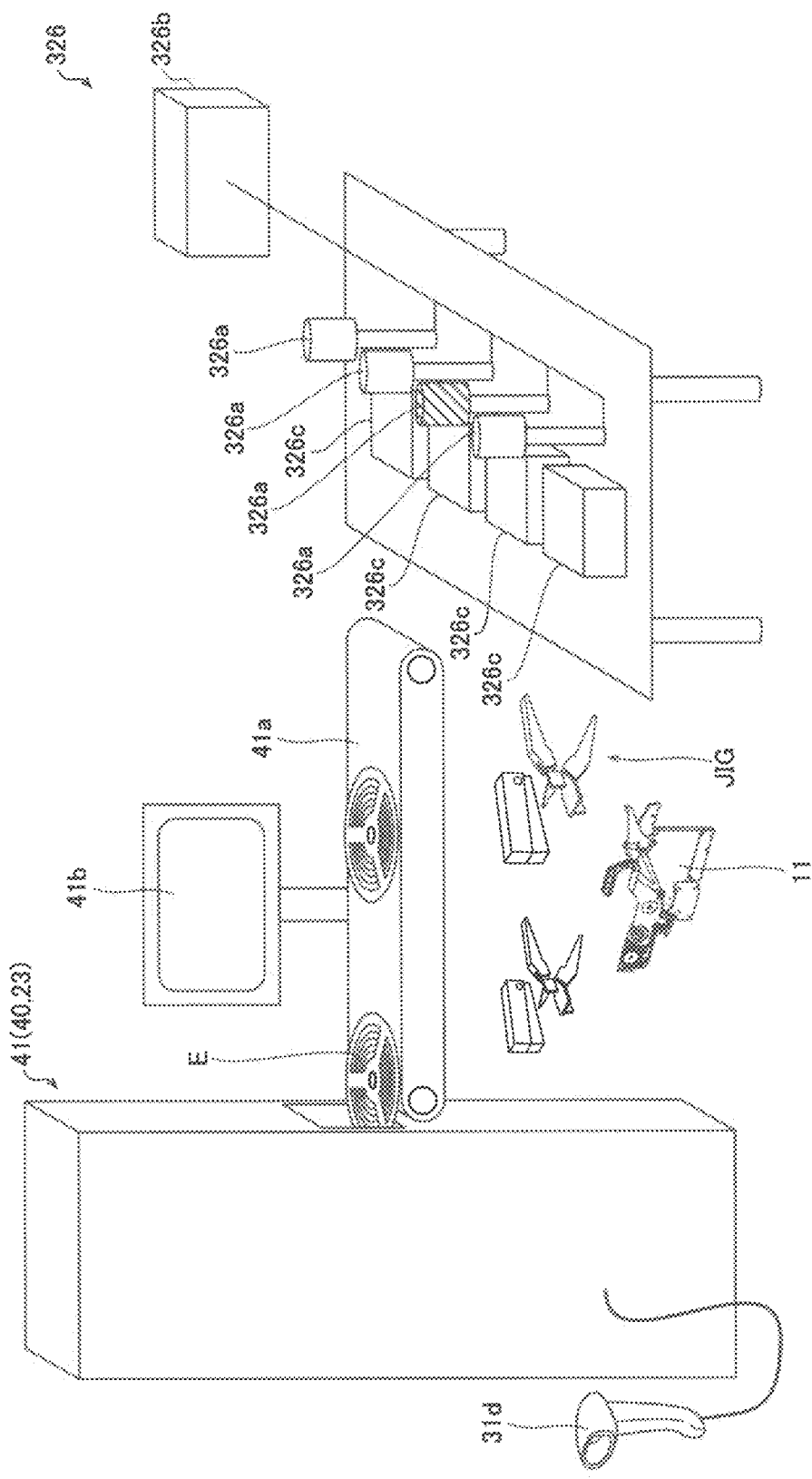

PARTS REPLENISHMENT SYSTEM AND PARTS REPLENISHMENT METHOD

CROSS-REFERENCE TO RELATED APPLICATION

This application is a National Stage of International Patent Application No. PCT/JP2018/042796, filed Nov. 20, 2018, the entire content of which is incorporated herein by reference.

BACKGROUND

Technical Field

The present disclosure relates to a parts replenishment system and a parts replenishment method, and more particularly, it relates to a parts replenishment system and a parts replenishment method for performing preprocessing on a packaging material for parts.

Background Art

Conventionally, a parts mounting device that mounts parts on a board is known. Generally, a parts supply device that supplies parts is attached to such a parts mounting device. When the parts supply device continues to supply the parts, the parts to be supplied are insufficient, and thus the parts supply device is replenished with parts. Replenishment parts are stored in a storage, and thus a worker takes the replenishment parts out of the storage and delivers the same from the storage to the parts supply device. Then, after preprocessing is performed on a packaging material for the parts, the worker attaches the replenishment parts to the parts supply device and replenishes the parts supply device with the parts.

Conventionally, a jig that performs such preprocessing on a packaging material for parts is known. Such a jig is disclosed in Japanese Patent Laying-Open No. 2016-036003, for example. Japanese Patent Laying-Open No. 2016-036003 discloses a tape cutting jig that performs cutting processing as preprocessing on a carrier tape (a packaging material for parts).

SUMMARY

Although not clearly described in Japanese Patent Laying-Open No. 2016-036003, the preprocessing on the packaging material for the parts may differ depending on a parts supply device. For example, the parts supply device includes an autoload-type parts supply device that automatically loads parts and a non-autoload-type parts supply device, but the preprocessing on the packaging material for the parts is different between the autoload-type parts supply device and the non-autoload-type parts supply device. Furthermore, the preprocessing on the packaging material for the parts differs depending on which manufacturer the parts supply device is made by.

On the other hand, when a worker does not know which type of parts supply device is the replenishment destination of the parts or which manufacturer the parts supply device to be replenished with the parts is made by, they go from a storage to the position of a parts mounting device to confirm the parts supply device that is the replenishment destination of the parts and perform preprocessing according to the confirmed parts supply device at the location. Therefore, when performing preprocessing on a plurality of packaging materials for the parts, the worker may perform the preprocessing on the plurality of packaging materials for the parts while moving between a plurality of parts supply devices. In this case, the burden required for the preprocessing on the packaging materials for the parts disadvantageously increases.

Accordingly, the present disclosure provides a parts replenishment system and a parts replenishment method that each enable a reduction in the burden required for preprocessing on packaging materials for parts.

A parts replenishment system configured to replenish a parts supply device attached to a parts mounting device with parts according to a first aspect of the present disclosure includes an instruction device configured to issue an instruction to unload the parts from a storage, and a presentation device configured to present preprocessing identification information for identifying preprocessing, which is processing on a packaging material for the parts for which an unloading instruction has been issued by the instruction device before replenishment of the parts supply device with the parts. In this description, the preprocessing identification information refers to information presenting the preprocessing, and includes characters, sounds, images, positions, etc., for example. Furthermore, in this description, the preprocessing indicates a broader concept including processing that does nothing to the packaging material for the parts.

In the parts replenishment system according to the first aspect of the present disclosure, as described above, the preprocessing identification information is presented such that the preprocessing on the packaging material for the parts to be replenished can be recognized in advance based on the preprocessing identification information, and thus the preprocessing on the packaging material for the parts can be performed without going from the storage to the position of the parts mounting device and confirming the parts supply device that is the replenishment destination of the parts. Consequently, for example, the preprocessing on a plurality of packaging materials for the parts can be performed collectively at a fixed position such as a position near the storage of the parts, and thus the burden required for the preprocessing on the packaging materials for the parts can be reduced. In this case, a tool (so-called "jig") necessary for the preprocessing on the packaging material for the parts is arranged at a fixed position such as a position near the storage of the parts such that it is not necessary to arrange the tool necessary for the preprocessing on the packaging material for the parts for each mounting line. Consequently, the number of tools necessary for the preprocessing on the packaging material for the parts arranged in the factory can be reduced.

In the aforementioned parts replenishment system according to the first aspect, the presentation device preferably includes a display device, and the display device is preferably configured to present the preprocessing identification information by displaying the preprocessing identification information. Accordingly, the preprocessing identification information can be easily recognized visually.

In this case, the display device is preferably configured to display information indicating a method for the preprocessing, information indicating a type of the parts supply device, or information indicating an unloading destination of the parts for performing the preprocessing as the preprocessing identification information. Accordingly, when the information indicating the method for the preprocessing is displayed as the preprocessing identification information, the contents themselves of the preprocessing can be directly recognized by the displayed method for the preprocessing. When the information indicating the type of parts supply device is displayed as the preprocessing identification information, the contents of the preprocessing can be indirectly recognized by knowing the displayed type of parts supply device. When the information indicating the unloading destination of the parts for performing the preprocessing is displayed as the preprocessing identification information, the contents of the preprocessing can be indirectly recognized by knowing the displayed unloading destination.

In the aforementioned parts replenishment system according to the first aspect, the presentation device preferably includes the storage, the storage preferably includes a plurality of stages to which the parts are unloaded to perform the preprocessing, and the storage is preferably configured to present the preprocessing identification information by differentiating the stages, which are unloading destinations of the parts, according to the preprocessing. Accordingly, the contents of the preprocessing can be easily and intuitively recognized by knowing the stages that are the unloading destinations.

In the aforementioned parts replenishment system according to the first aspect, the preprocessing is preferably determined based on the parts supply device, which is a replenishment destination of the parts for which the unloading instruction has been issued, and a packaging specification of the parts for which the unloading instruction has been issued. Accordingly, the preprocessing to be performed can be accurately determined based on the parts supply device that is the replenishment destination of the parts for which the unloading instruction has been issued and the packaging specification of the parts for which the unloading instruction has been issued.

In the aforementioned parts replenishment system according to the first aspect, the instruction device is preferably configured to issue a sorting instruction so as to sort a plurality of the parts to be unloaded by delivery destination when the plurality of the parts are unloaded. Accordingly, the plurality of parts are sorted by delivery destination, and thus the parts can be easily delivered to the parts supply device.

In this case, the parts replenishment system preferably further includes a sorting device configured to sort the parts. Accordingly, the sorting device can automatically sort the parts, and thus a worker can be saved the trouble of sorting the parts, unlike a case in which the worker sorts the parts.

In the aforementioned parts replenishment system according to the first aspect, the presentation device is preferably configured to present, in addition to the preprocessing identification information, information on attachment of the parts supply device to the parts mounting device when the parts supply device to be attached to the parts mounting device is not attached. Accordingly, the preprocessing on the packaging material for the parts to be replenished can be recognized in advance based on the preprocessing identification information, and the parts supply device to be attached can be known based on the information on attachment of the parts supply device to the parts mounting device. Consequently, the parts supply device to be attached can be prepared together with the parts to be replenished, and thus the burden required for preparation of the parts and the parts supply device can be reduced.

The aforementioned parts replenishment system according to the first aspect is preferably configured to store execution of the preprocessing in association with the parts on which the preprocessing has been executed. Accordingly, after the preprocessing, the state (the presence or absence of the preprocessing) of the parts being delivered to the parts mounting device can be understood, and thus the parts can be easily managed from the completion of the preprocessing to the delivery to the parts mounting device. This advantageous effect is effective in that when a period from the completion of the preprocessing to the delivery to the parts mounting device is long such as when the parts mounting device stops after the preprocessing, the presence or absence of the preprocessing on the parts being delivered can be confirmed.

In the aforementioned parts replenishment system according to the first aspect, the packaging material for the parts is preferably a tape member. Accordingly, for the parts for which the packaging material having various types of preprocessing is a tape member, the preprocessing on the packaging material for the parts can be recognized in advance.

In this case, the preprocessing is preferably processing on a leader of the tape member without the parts on a starting end side of the tape member. Accordingly, the preprocessing on the packaging material for the parts on the leader, which is a portion requiring the preprocessing, can be recognized in advance.

A parts replenishment method for replenishing a parts supply device attached to a parts mounting device with parts according to a second aspect of the present disclosure includes issuing an instruction to unload the parts from a storage, and presenting preprocessing identification information for identifying preprocessing, which is processing on a packaging material for the parts for which an unloading instruction has been issued before replenishment of the parts supply device with the parts.

In the parts replenishment method according to the second aspect of the present disclosure, with the structure as described above, similarly to the parts replenishment system according to the first aspect, it is possible to provide the parts replenishment method that enables a reduction in the burden required for the preprocessing on the packaging material for the parts. Furthermore, similarly to the parts replenishment system according to the first aspect, the number of tools necessary for the preprocessing on the packaging material for the parts arranged in the factory can be reduced.

In the aforementioned parts replenishment method according to the second aspect, the presenting of the preprocessing identification information preferably includes presenting the preprocessing identification information by displaying the preprocessing identification information on a display device. Accordingly, the preprocessing identification information can be presented easily and reliably.

According to the present disclosure, as described above, it is possible to provide the parts replenishment system and the parts replenishment method that each enable a reduction in the burden required for the preprocessing on the packaging materials for the parts.

BRIEF DESCRIPTION OF THE DRAWINGS

FIG. 2A is a diagram for illustrating device information, FIG. 2B is a diagram for illustrating replenishment requests, and FIG. 2C is a diagram for illustrating unloading instructions;

FIG. 5A is a diagram showing a tape member before cutting processing in a case in which the tape member, which is an embossed tape, is attached to an autoload-type parts supply device, FIG. 5B is a diagram showing the tape member after the cutting processing in a case in which the tape member, which is an embossed tape, is attached to the autoload-type parts supply device, FIG. 5C is a diagram showing the tape member before bending processing in a case in which the tape member, which is an embossed tape, is attached to the autoload-type parts supply device, and FIG. 5D is a diagram showing the tape member after the bending processing in a case in which the tape member, which is an embossed tape, is attached to the autoload-type parts supply device;

FIG. 6A is a diagram showing a tape member before peeling processing in a case in which the tape member, which is a paper tape, is attached to a non-autoload-type parts supply device, FIG. 6B is a diagram showing the tape member after the peeling processing in a case in which the tape member, which is a paper tape, is attached to the non-autoload-type parts supply device, FIG. 6C is a diagram showing the tape member before cutting processing in a case in which the tape member, which is a paper tape, is attached to the non-autoload-type parts supply device, and FIG. 6D is a diagram showing the tape member after the cutting processing in a case in which the tape member, which is a paper tape, is attached to the non-autoload-type parts supply device;

FIG. 9 is a diagram for illustrating information for selecting preprocessing according to the first embodiment;

FIG. 10 is a diagram for illustrating data showing the correspondence between a parts name and a usable feeder (parts supply device) according to the first embodiment;

FIG. 11 is a diagram for illustrating display of the preprocessing identification information according to the first embodiment;

FIG. 19 is a diagram for illustrating presentation of preprocessing identification information for a plurality of parts storages and parts sorting by delivery destination in a case in which the parts storage is a storage shelf according to a third embodiment; and FIG. 20 is a diagram for illustrating presentation of preprocessing identification information and parts sorting by delivery destination in a case in which a parts storage is a storage device according to a fourth embodiment.

DETAILED DESCRIPTION

Embodiments embodying the present disclosure are hereinafter described on the basis of the drawings.

First Embodiment

The structure of a parts mounting system 100 according to a first embodiment is described with reference to FIGS. 1 to 13.

(Structure of Parts Mounting System)

Figure 1:
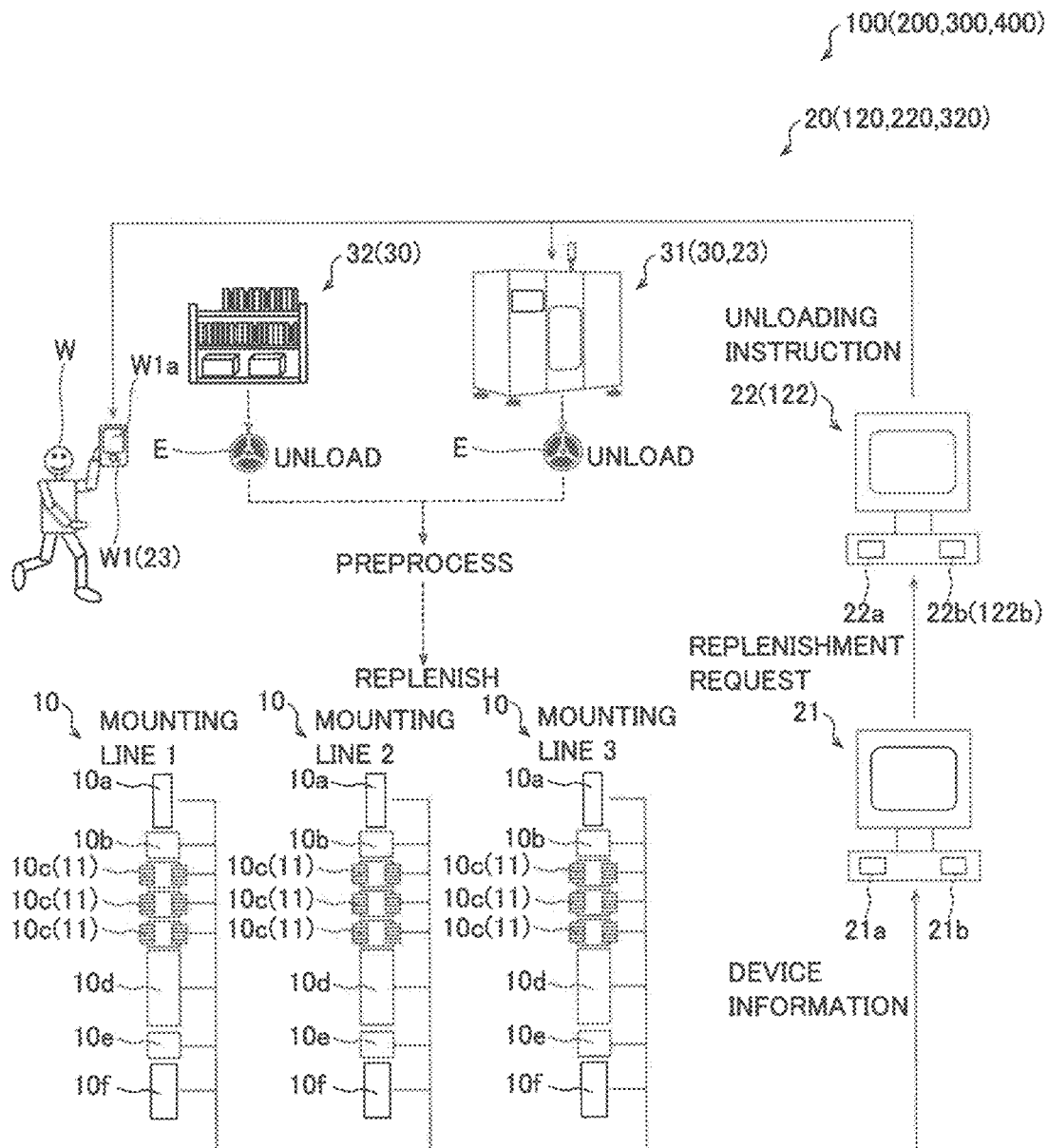
FIG. 1 is a schematic view showing the overall structure of a parts replenishment system according to first to fourth embodiments.

As shown in FIG. 1, the parts mounting system 100 is a system for mounting parts E (electronic parts) such as ICs, transistors, capacitors, and resistors on a board such as a printed circuit board and producing the board on which the parts E have been mounted. The parts mounting system 100 is provided in a board production factory. The parts mounting system 100 includes mounting lines 10 and a parts replenishment system 20.

(Structure of Mounting Line)

A mounting line 10 is a group of devices for producing the board on which the parts E have been mounted. Specifically, the mounting line 10 includes a board loader 10a, a printer 10b, parts mounting devices 10c, a reflow device 10d, an inspection device 10e, and a board unloader 10f. The board loader 10a, the printer 10b, the parts mounting devices 10c, the reflow device 10d, the inspection device 10e, and the board unloader 10f are arranged side by side in this order from the upstream side toward the downstream side in a board conveyance direction. Between the devices, a delivery conveyor (not shown) for conveying and delivering the board between the devices is arranged. The delivery conveyor conveys the board in the board conveyance direction and delivers the board from an upstream device to a downstream device.

The board loader 10a performs a board supply operation to supply the board to the printer 10b. The printer 10b performs a printing operation to screen-print a bonding material such as solder on the board supplied from the board loader 10a. The parts mounting devices 10c perform a mounting operation to mount the parts E on the board on which the printing operation has been performed by the printer 10b. A plurality of parts supply devices 11 that supply the parts E are attached to the parts mounting devices 10c. The reflow device 10d melts and solidifies the bonding material printed on the board so as to perform a reflow operation to bond the parts E to the board on which the mounting operation has been performed by the parts mounting devices 10c. The inspection device 10e performs an inspection operation to inspect the board on which the reflow operation has been performed by the reflow device 10d. The board unloader 10f performs a board storage operation to store the board on which the inspection operation has been performed by the inspection device 10e.

In the first to fourth embodiments, for convenience of description, an example in which three mounting lines 10 are provided is described. However, one mounting line 10 or a plurality of mounting lines 10 other than three may be provided. In the first to fourth embodiments, for convenience of description, an example in which a plurality of (three) mounting lines 10 include the same device group is described. However, the plurality of mounting lines 10 may include different device groups.

(Structure of Parts Replenishment System)

The parts replenishment system 20 is a system for replenishing the parts supply devices 11 attached to the parts mounting devices 10c with the parts E. Specifically, the parts replenishment system 20 includes a data aggregation device 21, an instruction device 22, and a presentation device 23. The data aggregation device 21 is a computer for aggregating data of the mounting lines 10. The data aggregation device 21 includes a communicator 21a and a controller 21b. The communicator 21a is an interface for communication, and communicably connects the data aggregation device 21 to each device of the mounting lines 10 and the instruction device 22. The controller 21b includes a processor such as a CPU, a memory, etc., and controls the operation of the data aggregation device 21.

The controller 21b of the data aggregation device 21 is configured to perform a control to acquire device information (see FIG. 2A) on the parts mounting devices 10c from the parts mounting devices 10c via the communicator 21a. The device information on the parts mounting devices 10c includes device-related information, parts-related information, and parts supply device-related information (feeder-related information). The device-related information includes information on the mounting line 10, information on a device number (machine No.), and information on board data. The parts-related information includes information on a parts name, information on an attachment position (set position), and information on the remaining number. The parts supply device-related information includes information on a specification, information on an attachment position (set position), and information on a setup state. The information on the specification of the parts supply device 11 includes information on a tape processing method of the parts supply device 11 such as an autoload method or a peeling and winding method (a method other than the autoload method).

During the operation of mounting the parts E on the board, the device information indicates the actual state of the parts mounting device 10c at that time, and the parts name, the remaining number of parts, the type of parts supply device 11, etc. for each set position at the present time are stored. A display as shown in FIG. 2A is also provided on a monitor of the data aggregation device 21. However, when the operation of mounting the parts E on the current board is stopped at the mounting line 10 to which the relevant parts mounting device 10c belongs and the type of board to be produced is changed, a display different from that of the component supply device 11 actually attached is provided. That is, when the type of board is changed, a board data name is first changed to the one corresponding to a board to be produced next, but the parts name and the set position of the parts-related information are changed to the ones specified in new board data due to a change in the board data. Data of the supply device and the set position of the feeder-related information is also changed to the one specified in the new board data.

When the parts supply devices 11 attached so far at this point and the parts E (parts name) to be supplied by those parts supply devices 11 match parts supply devices 11 and parts E (parts name) to be supplied that are specified in the new board data, the setup state is "completed", and the remaining number of parts-related information data becomes actual data without change. When the currently attached parts supply devices 11 or the parts E (parts name) to be supplied do not match the parts supply devices 11 and the parts E (parts name) to be supplied that are specified in the new board data, the setup state is "incompleted", and the remaining number of parts-related information data becomes "0", as shown in FIG. 2A. In FIG. 2A, the remaining number of parts is displayed as "0/5000", but "0" of the numerator indicates the remaining number, and "5000" of the denominator indicates the number of parts in a case in which a scheduled reel R is full. When the parts E with the correct parts supply devices 11 and the correct parts name indicated by the new board data are attached at the set positions at which the setup state is "incompleted", the setup state becomes "completed", and as for the remaining number, the actual number of attached parts E is stored and displayed. When the parts E with the correct parts supply devices 11 and the correct parts name are attached at all the set positions specified in the board data, the setup state becomes "completed" at all the specified set positions, and the production operation of a new board can be started. When the newly attached parts supply devices 11 are incorrect, the setup state does not become "completed", and the production operation is not possible until the correct parts supply devices 11 are attached.

Replenishment request data of FIG. 2B is synchronized with the attachment information data of FIG. 2A, and when the device information data of FIG. 2A is changed, the corresponding data is synchronized and changed such that the contents are the same. The "set position" of the device information of FIG. 2A corresponds to the "location" of the replenishment request of FIG. 2B, and the "setup state" of the attachment information of FIG. 2A corresponds to a "feeder setup state" of FIG. 2B. When the "setup state" of the device information of FIG. 2A is changed to "completed", the "feeder setup state" of the replenishment request of FIG. 2B becomes "completed".

The controller 21b of the data aggregation device 21 is configured to perform a control to transmit a replenishment request (see FIG. 2B) for the parts E to the instruction device 22 via the communicator 21a. The replenishment request information includes information on a parts name, information on the specifications of the parts supply devices 11, information (location information) on the attachment positions of the parts E (parts supply devices 11), and information on the setup states of the parts supply devices 11.

The instruction device 22 is a computer for issuing an instruction to unload the parts E from a storage 30. The instruction device 22 includes a communicator 22a and a controller 22b. The communicator 22a is an interface for communication, and communicably connects the instruction device 22 to the data aggregation device 21 and the presentation device 23. The controller 22*b* includes a processor such as a CPU, a memory, etc., and controls the operation of the instruction device 22.

The instruction device 22 is configured to perform a control to transmit the unloading instruction (see FIG. 2C) to the presentation device 23 (a storage device 31 of the storage 30 and a mobile terminal W1) via the communicator 22*a*. The unloading instruction information includes information on a parts name, information on preprocessing, and information (location information) on the attachment positions of the parts E (component supply devices 11).

The operation from unloading of the parts E from the storage 30 to replenishment of the parts supply devices 11 of the parts mounting devices 10*c* with the parts E is now described.

The parts E are stored in the storage 30 provided in the board production factory. Specifically, the parts E packaged in a tape member that is a packaging material E1 (see FIGS. 3A and 3B) are stored in the storage 30. More specifically, the parts E are stored in the storage 30 in a state in which the packaging material E1 is wound around a reel R (see FIG. 3A). Identification information R1 for identifying the parts E is attached to the reel R. The identification information R1 is a barcode, for example. The storage 30 includes the storage device 31 (storage) and a storage shelf 32. The storage device 31 is a device capable of storing a plurality of reels R (a plurality of parts E) and automatically unloading the stored parts E. The storage device 31 selects the parts E to be unloaded from the stored parts E based on the unloading instruction by the instruction device 22, and automatically unloads the parts E by an automatic unloading mechanism (not shown). The storage shelf 32 is a shelf capable of storing a plurality of reels R (a plurality of parts E), and does not have an automatic unloading mechanism.

The parts E to be unloaded may be parts E to be replenished due to running out of parts or a decrease in the remaining number of parts during the operation of mounting the parts on the board or may be new parts E to be attached by switching the type of board. In a case of switching the type of board, it may be necessary to newly unload the parts supply devices 11 to which the new parts E are loaded together with the new parts E. These are selected and instructed by the data aggregation device 21 and the instruction device 22 based on the "remaining number" or "setup state" information of the parts E of the attachment information of FIG. 2A.

A worker W takes parts E to be replenished from the storage device 31 or the storage shelf 32 based on the unloading instruction from the instruction device 22 to the mobile terminal W1 to be carried, and delivers the parts E to the parts supply device 11 that requires replenishment. Then, the worker W attaches the parts E to be replenished to the parts supply device 11 that requires replenishment and replenishes the parts supply device 11 with the parts E.

The worker W preprocesses the packaging material E1 for the parts E before replenishing the parts supply device 11 with the parts E.

The preprocessing on the tape member that is the packaging material E1 for the parts E is now described with reference to FIGS. 3 to 6. First, the structure of the tape member, which is the packaging material E1 for the parts E, is described with reference to FIGS. 3A and 3B.

Figure 3A:
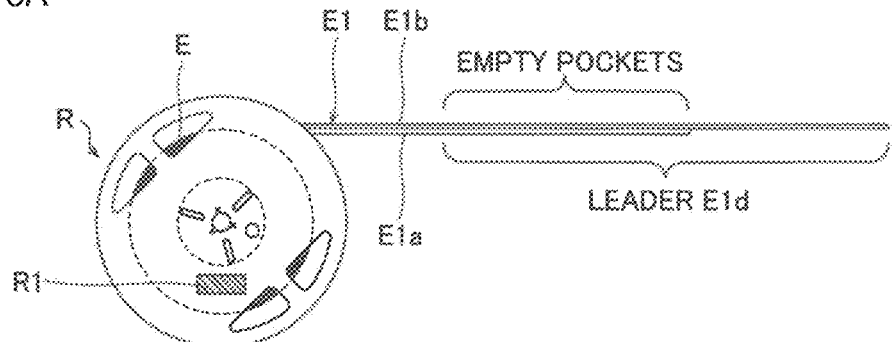
FIG. 3A is a diagram for illustrating a tape member that has stored parts.
Figure 3B:
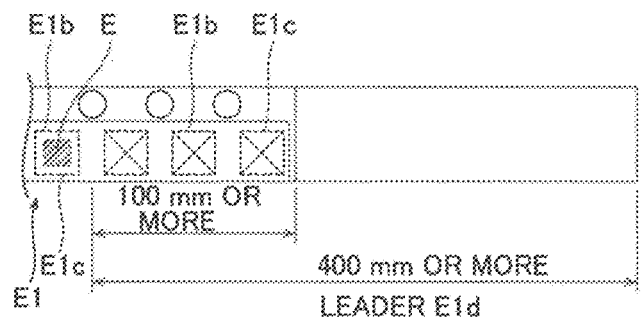
FIG. 3B is a diagram for illustrating a leader of the tape member that has stored the parts.

As shown in FIGS. 3A and 3B, the tape member, which is the packaging material E1 for the parts E, includes a carrier tape E1*a* for holding the parts E and a cover tape E1*b* attached on the carrier tape E1*a*. The carrier tape E1*a* has concave pockets E1*c* for holding (storing) the parts E.

The tape member, which is the packaging material E1 for the parts E, includes a leader E1*d* that is a portion without the parts E on the starting end side in a new and unused state. The leader E1*d* includes empty pockets E1*c* that do not hold the parts E. In "JIS C 0806-3", it is stipulated that the leader E1*d* has a length of 400 mm or more, and a portion with a length of 100 mm or more of the leader E1*d* that does not store the parts E is a tape sealed with the cover tape E1*b*. At the same time, it is stipulated that the entire leader E1*d* may be a tape that does not store the parts E sealed with the cover tape E1*b*.

Figure 4A:
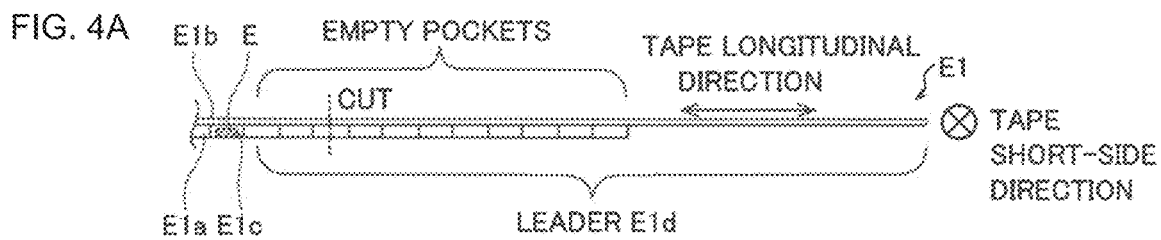
FIG. 4A is a diagram showing the tape member before cutting processing in a case in which the tape member, which is a paper tape, is attached to an autoload-type parts supply device.
Figure 4B:
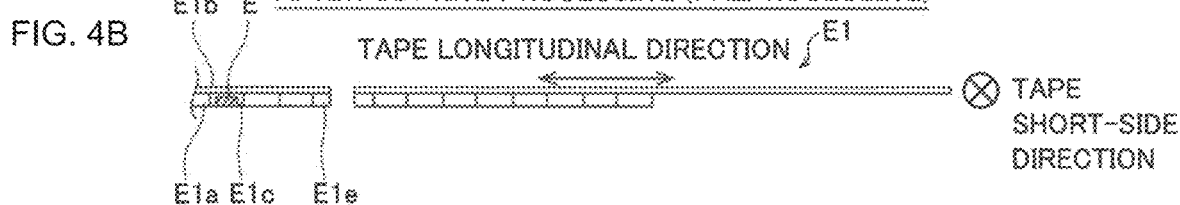
FIG. 4B is a diagram showing the tape member after the cutting processing in a case in which the tape member, which is a paper tape, is attached to the autoload-type parts supply device.
Figure 4C:
FIG. 4C is a diagram showing the tape member after bending processing in a case in which the tape member, which is a paper tape, is attached to the autoload-type parts supply device.

The tape member that is the packaging material E1 for the parts E includes a paper tape that is a tape made of paper and an embossed tape that is a tape made of resin. As shown in FIGS. 4A to 4C, the paper tape is formed as a flat tape in which the pockets E1*c* do not protrude. On the other hand, as shown in FIGS. 5A to 5D, the embossed tape is formed as a tape in which the pockets E1*c* protrude from the cover tape E1*b* side toward the side opposite to the cover tape E1*b* side.

The preprocessing on the tape member that is the packaging material E1 for the parts E in a case in which the tape member that is the packaging material E1 for the parts E is new is now described with reference to FIGS. 4 to 6. When the tape member that is the packaging material E1 for the parts E is new, the preprocessing is performed on the leader E1*d*.

In examples shown in FIGS. 4A to 4C, the preprocessing is performed on the tape member that is the paper tape for the parts E to be replenished to the autoload-type parts supply device 11 (tape feeder). In this case, as shown in FIGS. 4A and 4B, first, the leader E1*d* is cut by a cutting jig (see FIG. 7) that is a tool for preprocessing such that a predetermined number of empty pockets E1*c* remain. Then, as shown in FIG. 4C, a cut end E1*e* (the tip end of the tape member on the side having the parts E) of the leader E1*d* is held by a clamp jig (see FIG. 7) that is a tool for the preprocessing so as to bend toward the cover tape E1*b*. In the autoload-type parts supply device 11, a cutter (not shown) is inserted from the cut end E1*e* of the leader E1*d* such that the cover tape E1*b* is cut open by the cutter. Therefore, the cut end E1*e* of the leader E1*d* is bent toward the cover tape E1*b* such that the cutter can be easily inserted into the cut end E1*e* of the leader E1*d*.

In examples shown in FIGS. 5A to 5D, the preprocessing is performed on the tape member that is the embossed tape for the parts E to be replenished to the autoload-type parts supply device 11 (tape feeder). In this case, as shown in FIGS. 5A and 5B, first, the leader E1*d* is cut by the cutting jig (see FIG. 7) that is a tool for the preprocessing such that a predetermined number of empty pockets E1*c* remain. Then, as shown in FIGS. 5C and 5D, a cut end E1*e* (the tip end of the tape member on the side having the parts E) of the leader E1*d* is held by the clamp jig (see FIG. 7) that is a tool for the preprocessing such that a space between the carrier tape E1*a* and the cover tape E1*b* is opened. FIGS. 5C and 5D are diagrams showing the cut end E1*e* of the leader E1*d* as viewed from the cut end E1*e* side. In the autoload-type parts supply device 11, as described above, the cutter is inserted from the cut end E1*e* of the leader E1*d* such that the cover tape E1*b* is cut open by the cutter. Therefore, a space between the carrier tape E1*a* and the cover tape E1*b* is opened in the cut end E1*e* of the leader E1*d* such that the cutter can be easily inserted into the cut end E1*e* of the leader E1*d*.

In examples shown in FIGS. 6A to 6D, the preprocessing is performed on the tape member that is the paper tape for the parts E to be replenished to the peeling and winding-type parts supply device 11 (tape feeder). In this case, as shown in FIGS. 6A and 6B, first, the cover tape E1b of the leader E1d is peeled from the carrier tape E1a so as to be long enough to reach a winding roller (not shown) of the parts supply device 11. In the peeling and winding-type parts supply device 11, the cover tape E1b is pulled and wound by the winding roller such that the cover tape E1b is peeled from the carrier tape E1a. Therefore, the cover tape E1b of the leader E1d is peeled from the carrier tape E1a so as to be long enough to reach the winding roller. Then, as shown in FIGS. 6C and 6D, the carrier tape E1a of the leader E1d is cut by the cutting jig (see FIG. 7) that is a tool for the preprocessing such that the carrier tape E1a has a predetermined length. Even when the tape member is an embossed tape, the preprocessing is performed similarly to a case in which the tape member is a paper tape.

As described above, the preprocessing on the packaging material E1 for the parts E differs depending on the specification (such as the autoload-type or the peeling and winding-type) of the parts supply device 11 and the packaging specification (such as a paper tape or an embossed tape) of the tape member.

Even the autoload-type or the peeling and winding-type parts supply device 11 can be further subdivided into different types, but the preprocessing on the packaging material E1 for the parts E may be different even in the respective subdivided types of parts supply devices 11. For example, the autoload-type parts supply device 11 includes not only a cutout-type (the method described with reference to FIGS. 4 and 5) parts supply device in which the cover tape E1b is cut and opened in the feed direction of the carrier tape E1a such that the parts E are exposed, but also a so-called one-sided peeling-type parts supply device in which on both sides of the cover tape E1b and the pocket E1c of the carrier tape E1a, only one side of an adhesive (welded) portion (see FIGS. 5C and 5D) extending in the longitudinal direction of the carrier tape E1a is peeled such that the cover tape E1b is opened, and the parts E are exposed. In this one-sided peeling-type parts supply device 11, preprocessing different from that of the cutout-type parts supply device 11 may be performed.

Therefore, in the first embodiment, as shown in FIGS. 7 to 12, the presentation device 23 is configured to present preprocessing identification information for identifying the preprocessing on the packaging material E1 for the parts E for which the instruction device 22 has issued an unloading instruction. The presentation device 23 includes the storage device 31 of the storage 30. Furthermore, the presentation device 23 includes the mobile terminal W1 carried by the worker W. The preprocessing is determined based on the parts supply device 11 that is the replenishment destination of the parts E for which the unloading instruction has been issued and the packaging specification of the parts E for which the unloading instruction has been issued. Specifically, the preprocessing type can be determined based on preprocessing selection information (preprocessing selection table) of FIG. 9 stored in the data aggregation device 21 or the instruction device 22. This preprocessing selection information indicates a required preprocessing type based on a combination of the type of parts supply device 11 indicated by a feeder type with the parts type indicated by the type of parts and the type of carrier tape E1a for accommodating the parts type. The storage device 31 of the storage 30 and the mobile terminal W1 are examples of a "display device" in the claims.

Figures 7, 8A, 8B:
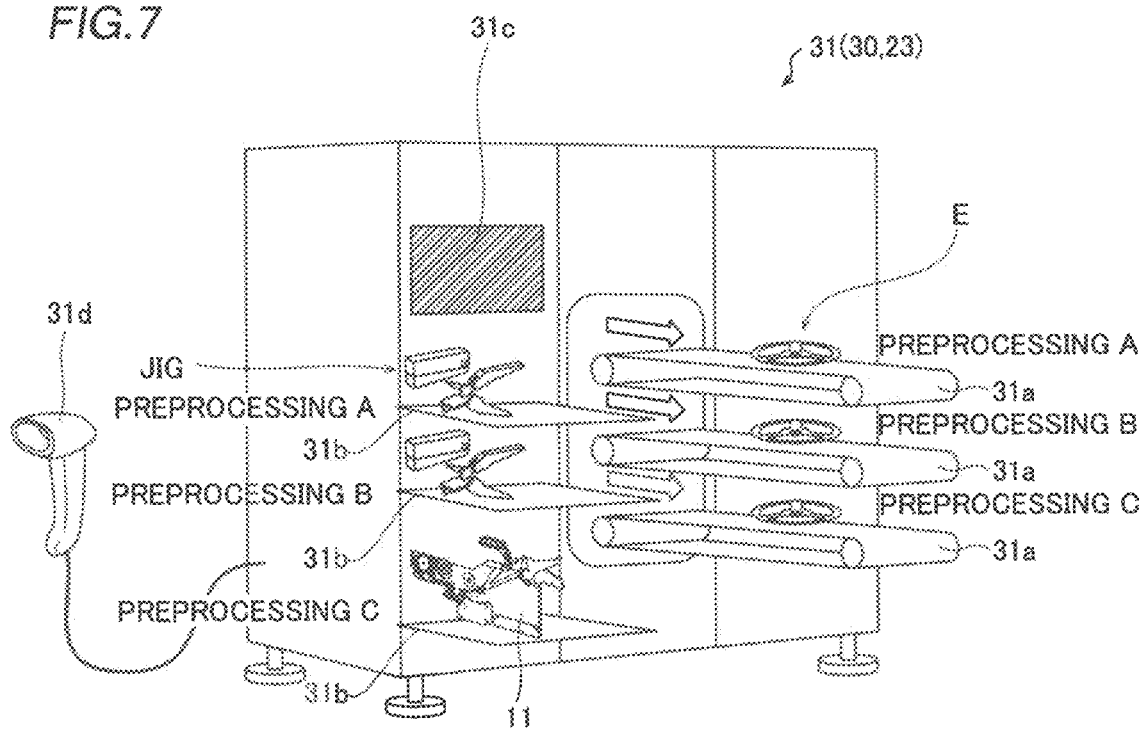
FIG. 7 is a diagram for illustrating presentation of preprocessing identification information in a case in which a parts storage is a storage device according to the first embodiment.
FIG. 8A is a diagram for illustrating display of the preprocessing identification information according to the first embodiment.
FIG. 8B is a diagram for illustrating display of the preprocessing identification information and information on attachment of a parts supply device according to the first embodiment.

As shown in FIG. 7, the storage device 31 of the storage 30 includes a plurality of stages 31a to which the parts E is unloaded for preprocessing. Each of the stages 31a includes a belt conveyor capable of conveying the unloaded parts E. The storage device 31 of the storage 30 is configured to present the preprocessing identification information by differentiating the stages 31a, which is the unloading destination of the parts E for performing the preprocessing. Specifically, the storage device 31 of the storage 30 is configured to present the position of the stage 31a, which is the unloading destination of the parts E for performing the preprocessing, as the preprocessing identification information. The storage device 31 of the storage 30 is configured to unload the parts E to the stage 31a that is the corresponding unloading destination based on the unloading instruction by the instruction device 22.

In an example shown in FIG. 7, three stages 31a including a stage 31a for preprocessing A, a stage 31a for preprocessing B, and a stage 31a for preprocessing C are provided. The preprocessing A, the preprocessing B, and the preprocessing C are different from each other. The parts E on which the preprocessing A is performed are unloaded to the stage 31a for the preprocessing A. The parts E on which the preprocessing B is performed are unloaded to the stage 31a for the preprocessing B. The parts E on which the preprocessing C is performed are unloaded to the stage 31a for the preprocessing C.

The storage device 31 of the storage 30 includes a jig placement portion 31b for placing a jig for the preprocessing on the parts E. A plurality of jig placement portions 31b are provided according to the preprocessing. In the example shown in FIG. 7, three jig placement portions 31b including a jig placement portion 31b for the preprocessing A, a jig placement portion 31b for the preprocessing B, and a jig placement portion 31b for the preprocessing C are provided. A jig for performing the preprocessing A is placed on the jig placement portion 31b for the preprocessing A. A jig for performing the preprocessing B is placed on the jig placement portion 31b for the preprocessing B. A jig for performing the preprocessing C is placed on the jig placement portion 31b for the preprocessing C. On the jig placement portion 31b, the parts supply device 11 can be placed. The parts supply device 11 is stored in a storage different from the storage 30 for the parts E.

In the first embodiment, the storage device 31 of the storage 30 includes a display 31c capable of displaying information. The display 31c includes a liquid crystal monitor, for example. As shown in FIG. 7 and FIGS. 8A and 8B, the storage device 31 of the storage 30 is configured to present the preprocessing identification information by displaying the preprocessing identification information on the display 31c. Specifically, the storage device 31 of the storage 30 is configured to display information indicating a method for the preprocessing or information indicating the type of parts supply device 11 on the display 31c as the preprocessing identification information. Note that FIGS. 8A and 8B show examples in which the information indicating the method for the preprocessing is displayed as the preprocessing identification information.

Specifically, in FIG. 8A, information indicating the type of jig for preprocessing to be used, such as "process parts with jig for preprocessing A", is displayed as the information indicating the method for the preprocessing. Similarly, in FIG. 8B, information indicating the type of jig for preprocessing to be used, such as "process parts with jig for preprocessing C", is displayed as the information indicating the method for the preprocessing. However, as the information indicating the method for the preprocessing, not only the information indicating the type of jig for preprocessing to be used but also more detailed information as described with reference to FIGS. 4 to 6 may be displayed. For example, in addition to the information indicating the type of jig for preprocessing to be used, information indicating a cutting position for performing cutting processing on the packaging material E1 for the parts E may be displayed as the information indicating the method for the preprocessing.

For example, when it is necessary to add two empty pockets E1c to the tip end of the carrier tape E1a and perform the cutting processing at a cutting position at which a half of an empty pocket is left, "cut leader such that only two empty pockets and a half remain" may be added to the display of FIG. 8A. At this time, a display such as "pinch and bend cut end face with clamp jig for preprocessing A" indicating processing after the cutting processing may be added.

Furthermore, for example, when it is necessary to add six empty pockets E1c to the tip end of the carrier tape E1a and perform the cutting processing at a cutting position at which a half of an empty pocket is left, "cut carrier tape of leader such that six empty pockets and a half remain at tip end of carrier tape" may be added to the display of FIG. 8B. At this time, a display such as "peel cover tape of leader from carrier tape such that cover tape is long enough to reach winding roller" indicating processing before the cutting processing may be added.

When the display 31c includes a touch panel, for example, a detail button displayed on the display 31c, which is a touch panel, may be pressed such that a detailed display is provided. For example, the detail button displayed on the display 31c is pressed while the outline "process parts with jig for preprocessing A" is displayed, a detailed display such as "cut leader such that only two empty pockets and a half remain" or "pinch and bend cut end face with clamp jig for preprocessing A" may be further provided.

The information indicating the method for the preprocessing may be displayed not only as character information as shown in FIGS. 8A and 8B, but also as graphic information (illustration). For example, graphic information (illustration) indicating the preprocessing procedure as shown in FIGS. 4A to 4C or FIGS. 6A to 6D may be displayed as the information indicating the method for the preprocessing. Furthermore, the information indicating the method for the preprocessing may be displayed by a combination of character information with graphic information. When the display 31c includes a touch panel, for example, the detail button displayed on the display 31c, which is a touch panel, may be pressed such that the graphic information indicating the preprocessing procedure is displayed as a detailed display.

Preprocessing may not be performed. In this case, not performing preprocessing may be displayed as the information indicating the method for the preprocessing.

The storage device 31 of the storage 30 includes a reader 31d that reads identification information R1 (see FIG. 3A) for identifying parts E. The reader 31d is a barcode reader, for example. When the identification information R1 is read by the reader 31d, the storage device 31 of the storage 30 displays preprocessing identification information on the parts E for which the identification information R1 has been read on the display 31c. At this time, the storage device 31 of the storage 30 displays information on a stage 31a and information on a parts name in addition to the preprocessing identification information on the parts E for which the identification information R1 has been read on the display 31c.

In addition to the identification information R1, an identification indication indicating a reel ID for identifying an individual reel R is often attached to the reel R around which the packaging material E1 that is a tape member has been wound. This identification indication is a bar code, for example. The identification indication may be provided at a position different from that of the identification information R1, or may be an integrated indication such that both the identification indication and the identification information R1 can be read by one reading of the bar code reader. The reel ID makes it possible to identify an individual reel R even when the parts type of parts E to be stored is the same. When the reel ID is attached to the reel R, the individual reel ID read by the reader 31d may be associated with the contents of the preprocessing, for example, at a stage at which the preprocessing on the packaging material E1 that is a tape member of the reel R to which the reel ID is attached is completed. In this case, the parts replenishment system 20 stores execution of the preprocessing and the contents of the executed preprocessing in association with the reel ID of the reel R around which the packaging material E1, which is a tape member on which the preprocessing has been executed, has been wound. For example, the storage device 31 of the storage 30 transmits the fact that the preprocessing on the packaging material E1, which is the tape member of the reel R from which the reel ID has been read, has been executed to the data aggregation device 21 or the instruction device 22 when the reel ID is read at the same time as the identification information R1 by the reader 31d after the preprocessing. When the display 31c includes a touch panel, for example, a preprocessing end button displayed on the display 31c, which is a touch panel, is pressed such that the storage device 31 of the storage 30 transmits the fact that the preprocessing on the packaging material E1, which is the tape member of the reel R from which the reel ID has been read, has been executed to the data aggregation device 21 or the instruction device 22. Then, the data aggregation device 21 or the instruction device 22 stores execution of the preprocessing and the contents of the executed preprocessing in association with the reel ID of the reel R around which the packaging material E1, which is the tape member on which the preprocessing has been executed, has been wound.

Furthermore, it is conceivable to store the reel ID of the reel R around which the packaging material E1, which is the preprocessed tape member, has been wound in association with the instruction number of the data of the unloading instruction in FIG. 2C. For example, the reel ID of the reel R around which the packaging material E1, which is the preprocessed tape member, has been wound is stored in association with a parts processing instruction (parts processing method; the type A of the unloading instruction 1 or the like). Furthermore, for example, the reel ID of the reel R around which the packaging material E1, which is the preprocessed tape member, has been wound is stored in association with a location ("line 1, machine 1, SetNo. 1" of the unloading instruction 1 or the like). By doing so, it is possible to prevent mistakes when the worker W carries the reel R to attach the same to the parts supply device 11 of the parts mounting device 10c to which the reel R should be attached. That is, when the reel R is attached to the parts supply device 11, an identification indication (such as a bar code) attached to the parts supply device 11 to which the reel R is intended to be attached and corresponding to that parts supply device 11 is read, and the identification information R1 of the reel R to be attached is further read such that it is possible to check whether or not it is the same as the stored association and give a warning when a mistake is made. This association may be made only with the location in the unloading instruction of FIG. 2C, or may be made only with the parts processing instruction (parts processing method). Furthermore, it may be associated with the type (such as the autoload-type or peeling and winding-type) of parts supply device 11 to be processed. When it is associated with the parts processing method or the type of parts supply device 11, it is possible to deal with a case in which the same parts type is attached at another attachment location as an alternative.

When the reel R is attached to the parts supply device 11 of the parts mounting device 10c, it is assumed that there is association of the attachment location (SetNo) of the parts supply device 11 with the identification indication of the individual parts supply device 11 such that the attachment location can be identified by reading the identification indication attached to the parts supply device 11. Alternatively, association of the identification indication of the parts supply device 11 with the parts processing instruction (parts processing method) for that parts supply device 11 or association of the identification indication of the parts supply device 11 with the type (autoload-type or peeling and winding-type) of parts supply device 11 is required.

When a robot automatically attaches the reel R for which the preprocessing has been completed to the parts supply device 11 to which the reel R should be attached instead of the worker W, the individual reel ID for which the preprocessing has been completed is conceivably stored in association with the location (SetNo) of the parts supply device 11 to which the reel R should be attached, and the robot conceivably attaches the reel R to the parts supply device 11 based on the association.

In the first embodiment, as shown in FIG. 8B, when the parts supply device 11 to be attached to the parts mounting device 10c is not attached, the storage device 31 of the storage 30 presents information on attachment of the parts supply device 11 to the parts mounting device 10c in addition to the preprocessing identification information. Specifically, the storage device 31 of the storage 30 displays the preprocessing identification information and the information on attachment of the parts supply device 11 on the display 31c to present the preprocessing identification information and the information on attachment of the parts supply device 11.

Note that "when the parts supply device 11 to be attached to the parts mounting device 10c is not attached" refers to "when the parts supply devices 11 are not attached at the set positions at which the parts supply devices 11 should be attached", "when the parts supply device 11 that is not compatible with the parts E to be unloaded is attached", "when the parts supply device 11 that is not compatible with the packaging material E1 for the parts E to be unloaded is attached", etc. Although a plurality of forms of packaging materials E1 (tape members) may be prepared to store the parts E, it can be said that the parts supply device 11 that cannot supply the parts E using any packaging material E1 is not compatible with the parts E. For example, only a parts supply device 11 for a wide tape having an applicable tape width of 12 mm or 16 mm can be compatible with large parts E that cannot fit in a tape width of 8 mm. Although a plurality of forms of packaging materials E1 (tape members) such as a paper tape and an embossed tape are prepared for the same type of parts E, it can be said that the parts supply device 11 that can supply only a paper tape is "not compatible with the parts E" when the parts E to be unloaded are stored in an embossed tape.

FIG. 10 exemplifies data showing the correspondence between the parts name included in the board data in which a program for parts mounting has been stored for each type of board and a usable feeder (parts supply device 11). When the parts E that are compatible only with type C are set in the board data as in the case of "parts 3" in this data, attaching the parts supply device 11 other than type C at the set position indicates that the parts supply device 11 that is not compatible with the packaging material E1 for the parts E to be unloaded is attached. This may occur when the parts supply device 11 for the type of board before switching in the board data is different from the parts supply device 11 after switching of the type of board.

In an example of the board data in FIG. 10, there are two types of feeders that can be used for "parts 1" and "parts 2". This is a case in which the parts E for which the packaging material E1 is the same can be supplied by either the autoload-type parts supply device 11 or the peeling and winding-type parts supply device 11, for example. In such a case, setup information of the feeder-related information in the device information of FIG. 2 is "completed" regardless of which type of parts supply device 11 in the column of the usable feeder is attached. After that, the preprocessing type is selected based on the preprocessing selection information of FIG. 9 according to the type of attached parts supply device 11. Furthermore, even when a plurality of types are possible in the column of the usable feeder of the board data, one of the plurality of types is selected in advance by the data aggregation device 21, for example, such that only one data can be set in the column of the supply device of the feeder-related information of FIG. 2. Accordingly, the type of parts supply device 11 can be systematically determined such that another parts supply device 11 other than that is not attached.

When the plurality of types are possible in the column of the usable feeder, as shown in FIG. 11, instead of selecting one of the plurality of types in advance by the data aggregation device 21, information for selecting which of the usable parts supply devices 11 is used may be displayed on the display 31c of the storage device 31 of the storage 30, for example. In this case, the parts supply device 11 used by worker W can be selected. When the information for selecting the parts supply device 11 to be used is displayed, the preprocessing identification information corresponding to the selected parts supply device 11 may be further displayed. In FIG. 11, as the preprocessing identification information, information indicating that "when type B is selected, perform preprocessing B" and "when type C is selected, perform preprocessing C" is displayed.

In examples shown in FIG. 7 and FIGS. 8A and 8B, first, the parts E to be replenished are unloaded to the stage 31a of the storage device 31 of the storage 30 based on the unloading instruction by the instruction device 22. At this time, the parts E are unloaded to the stage 31a to which the parts E should be unloaded according to the preprocessing. Then, the worker W identifies the preprocessing based on the position of the stage 31a on which the parts E are arranged. Alternatively, the identification information R1 is read by the reader 31d such that the preprocessing identification information on the parts E is displayed on the display 31c, and the worker W identifies the preprocessing based on the preprocessing identification information (characters) displayed on the display 31c. Then, when the preprocessing is identified, the worker W performs the preprocessing with the jig arranged on the jig placement portion 31b, using the stage 31a as a workbench. Then, the worker W delivers the preprocessed parts E to the parts supply device 11 that requires replenishment of the parts E.

Figure 12:
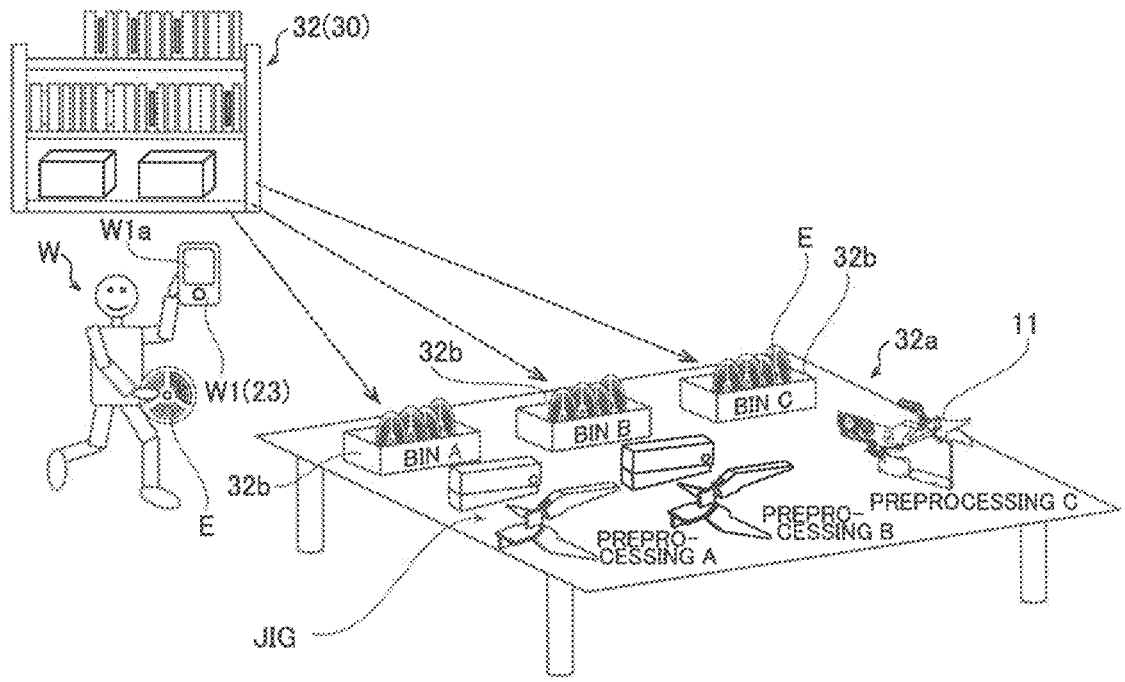
FIG. 12 is a diagram for illustrating presentation of the preprocessing identification information in a case in which the parts storage is a storage shelf according to the first embodiment.

As shown in FIG. 12, the mobile terminal W1 includes a display W1a capable of displaying information. The display W1a includes a liquid crystal monitor, for example. The mobile terminal W1 is configured to present the preprocessing identification information by displaying the preprocessing identification information on the display W1a. Specifically, the mobile terminal W1 is configured to display the information indicating the method for the preprocessing, the information indicating the type of parts supply device 11, or the information indicating the unloading destination (a sorting box 32b described below) of the parts E for performing the preprocessing as the preprocessing identification information on the display W1a. Information as shown in FIGS. 8A and 8B is displayed on the display W1a, for example. Therefore, the mobile terminal W1 is configured to present information on attachment of the parts supply device 11 to the parts mounting device 10c in addition to the preprocessing identification information when the parts supply device 11 to be attached to the parts mounting device 10c is not attached. Also in this case, the reel ID may be associated with the contents of the preprocessing or the instruction number of the data of the unloading instruction, for example, at a stage at which the preprocessing is completed.

In an example shown in FIG. 12, first, the worker W unloads the parts E to be replenished from the storage shelf 32 of the storage 30 based on the unloading instruction by the instruction device 22. Then, the worker W delivers the parts E to the jig placement portion 32a for placing the jig for the preprocessing on the parts E. On the jig placement portion 32a, the jig corresponding to the preprocessing is arranged, and the sorting box 32b for sorting the parts E according to the preprocessing is arranged. Furthermore, the jig placement portion 32a is provided near the storage shelf 32 of the storage 30. When the parts E are delivered to the jig placement portion 32a, the worker W identifies the preprocessing based on the preprocessing identification information (characters) displayed on the display W1a of the mobile terminal W1. Then, the worker W sorts the parts E into the corresponding sorting box 32b according to the identified preprocessing. Then, the worker W performs the preprocessing with the jig arranged on the jig placement portion 32a, using the jig placement portion 32a as a workbench. Then, the worker W delivers the preprocessed parts E to the parts supply device 11 that requires replenishment of the parts E.

Figure 13:
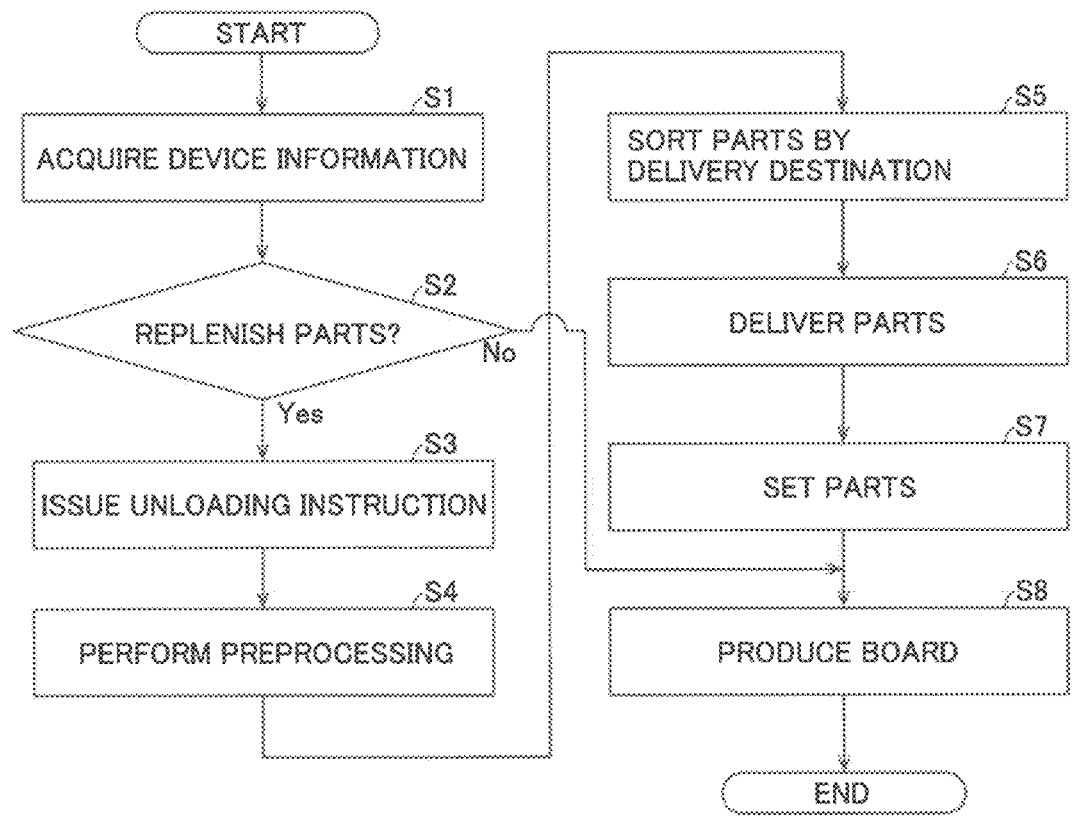
FIG. 13 is a flowchart for illustrating parts replenishment processing according to the first embodiment.

Parts replenishment processing according to the first embodiment is now described based on a flowchart with reference to FIG. 13.

As shown in FIG. 13, first, in step S1, the device information is acquired by the data aggregation device 21.

Then, in step S2, it is determined whether or not the parts E are replenished by the data aggregation device 21. When it is determined that the parts E are not replenished, the processing advances to step S8. When it is determined that the parts E are replenished, the replenishment request is transmitted from the data aggregation device 21 to the instruction device 22, and the processing advances to step S3.

Then, in step S3, the instruction device 22 issues the unloading instruction. Thus, the storage device 31 of the storage 30 or the mobile terminal W1 presents the preprocessing identification information to the worker W.

Then, in step S4, the preprocessing on the packaging material E1 for the parts E is performed by the worker W.

Then, in step S5, the worker W sorts the parts E by delivery destination. Either the processing operation in step S4 or the processing operation in step S5 may be performed first.

Then, in step S6, the parts E are delivered to the delivery destination by the worker W.

Then, in step S7, the worker W sets (attaches) the parts E at the delivery destination.

Then, in step S8, the board is produced using the mounting line 10. Then, the parts replenishment processing is terminated.

Advantageous Effects of First Embodiment

According to the first embodiment, the following advantageous effects are achieved.

According to the first embodiment, as described above, the preprocessing identification information is presented such that the preprocessing on the packaging material E1 for the parts E to be replenished can be recognized in advance based on the preprocessing identification information, and thus the preprocessing on the packaging material E1 for the parts E can be performed without going from the storage 30 to the position of the parts mounting device 10c and confirming the parts supply device 11 that is the replenishment destination of the parts E. Consequently, for example, the preprocessing on a plurality of packaging materials E1 for the parts E can be performed collectively at a fixed position such as a position near the storage 30 of the parts E, and thus the burden required for the preprocessing on the packaging materials E1 for the parts E can be reduced. In this case, a tool (so-called "jig") necessary for the preprocessing on the packaging material E1 for the parts E is arranged at a fixed position such as a position near the storage 30 of the parts E such that it is not necessary to arrange the tool necessary for the preprocessing on the packaging material E1 for the parts E for each mounting line. Consequently, the number of tools necessary for the preprocessing on the packaging material E1 for the parts E arranged in the factory can be reduced.

According to the first embodiment, as described above, the presentation device 23 includes the storage device 31 of the storage 30 and the mobile terminal W1 that are display devices. Furthermore, the display devices as the storage device 31 of the storage 30 and the mobile terminal W1 are configured to present the preprocessing identification information by displaying the preprocessing identification information. Accordingly, the preprocessing identification information can be easily recognized visually.

According to the first embodiment, as described above, the display devices as the storage device 31 of the storage 30 and the mobile terminal W1 are configured to display the information indicating the method for the preprocessing, the information indicating the type of parts supply device 11, or the information indicating the unloading destination of the parts E for performing the preprocessing as the preprocessing identification information. Accordingly, when the information indicating the method for the preprocessing is displayed as the preprocessing identification information, the contents themselves of the preprocessing can be directly recognized by the displayed method for the preprocessing. When the information indicating the type of parts supply device 11 is displayed as the preprocessing identification information, the contents of the preprocessing can be indirectly recognized by knowing the displayed type of parts supply device 11. When the information indicating the unloading destination of the parts E for performing the preprocessing is displayed as the preprocessing identification information, the contents of the preprocessing can be indirectly recognized by knowing the displayed unloading destination.

According to the first embodiment, as described above, the presentation device 23 includes the storage device 31 of the storage 30. Furthermore, the storage device 31 of the storage 30 includes the plurality of stages 31a to which the parts E are unloaded to perform the preprocessing. Moreover, the storage device 31 of the storage 30 is configured to present the preprocessing identification information by differentiating the stages 31a that are the unloading destinations of the parts E according to the preprocessing. Accordingly, the contents of the preprocessing can be easily and intuitively recognized by knowing the stages 31a that are the unloading destinations.

According to the first embodiment, as described above, the preprocessing is determined based on the parts supply device 11 that is the replenishment destination of the parts E for which the unloading instruction has been issued and the packaging specification of the parts E for which the unloading instruction has been issued. Accordingly, the preprocessing to be performed can be accurately determined based on the parts supply device 11 that is the replenishment destination of the parts E for which the unloading instruction has been issued and the packaging specification of the parts E for which the unloading instruction has been issued.

According to the first embodiment, as described above, the presentation device 23 is configured to present the information on attachment of the parts supply device 11 to the parts mounting device 10c in addition to the preprocessing identification information when the parts supply device 11 to be attached to the parts mounting device 10c is not attached. Accordingly, the preprocessing on the packaging material E1 for the parts E to be replenished can be recognized in advance based on the preprocessing identification information, and the parts supply device 11 to be attached can be known based on the information on attachment of the parts supply device 11 to the parts mounting device 10c. Consequently, the parts supply device 11 to be attached can be prepared together with the parts E to be replenished, and thus the burden required for preparation of the parts E and the parts supply device 11 can be reduced.

According to the first embodiment, as described above, the parts replenishment system 20 is configured to store execution of the preprocessing in association with the parts E on which the preprocessing has been executed. Accordingly, after the preprocessing, the state (the presence or absence of the preprocessing) of the parts E being delivered to the parts mounting device 10c can be understood, and thus the parts E can be easily managed from the completion of the preprocessing to the delivery to the parts mounting device 10c. This advantageous effect is effective in that when a period from the completion of the preprocessing to the delivery to the parts mounting device 10c is long such as when the parts mounting device 10c stops after the preprocessing, the presence or absence of the preprocessing on the parts E being delivered can be confirmed.

According to the first embodiment, as described above, the packaging material E1 for the parts E is a tape member. Accordingly, for the parts E for which the packaging material E1 having various types of preprocessing is a tape member, the preprocessing on the packaging material E1 for the parts E can be recognized in advance.

According to the first embodiment, as described above, the preprocessing is processing on the leader E1d, which is a portion of the tape member without the parts E on the starting end side. Accordingly, the preprocessing on the packaging material E1 for the parts E on the leader E1d, which is a portion requiring the preprocessing, can be recognized in advance.

First Modified Example of First Embodiment

A first modified example of the first embodiment is now described with reference to FIG. 14. In the first modified example of the first embodiment, an example is described in which a storage device of a storage includes only one stage, unlike the aforementioned first embodiment in which the storage device of the storage includes the plurality of stages. The same or similar structures as those of the first embodiment are denoted by the same reference numerals, and description thereof is omitted.

Figure 14:
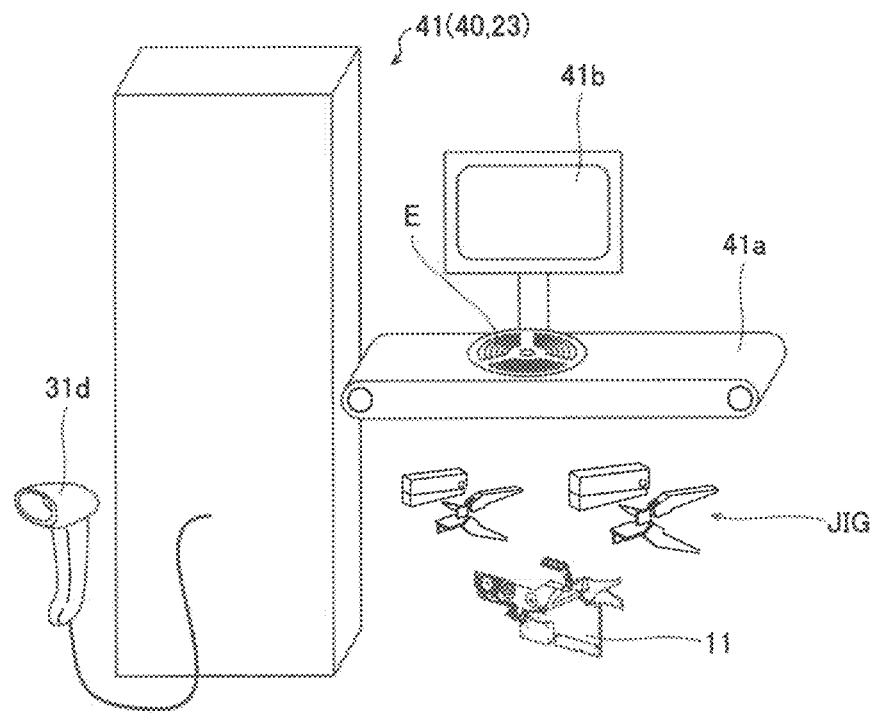
FIG. 14 is a diagram for illustrating presentation of preprocessing identification information in a case in which a parts storage is a storage device according to a first modified example of the first embodiment.

As shown in FIG. 14, a storage device 41 of a storage 40 according to the first modified example of the first embodiment of the present disclosure includes only one stage 41a.

The stage 41a is a stage to which parts E are unloaded to perform preprocessing. The stage 41a includes a belt conveyor capable of conveying the unloaded parts E. The stage 41a includes a display 41b capable of displaying information. The display 41b includes a liquid crystal monitor, for example.

The storage device 41 of the storage 40 is configured to present preprocessing identification information by displaying the preprocessing identification information on the display 41b. Specifically, the storage device 41 of the storage 40 is configured to display information indicating a method for the preprocessing or information indicating the type of parts supply device 11 as the preprocessing identification information on the display 41b. Information as shown in FIGS. 8A and 8B is displayed on the display 41b, for example. Furthermore, the storage device 41 of the storage 40 is configured to display the preprocessing identification information on the parts E from which identification information R1 has been read on the display 41b when the identification information R1 is read by a reader 31d.

In an example shown in FIG. 14, first, the parts E to be replenished are unloaded to the stage 41a of the storage device 41 of the storage 40 based on an unloading instruction by an instruction device 22. Then, a worker W reads the identification information R1 with the reader 31d to display the preprocessing identification information on the parts E on the display 41b and identify the preprocessing based on the preprocessing identification information (characters) displayed on the display 41b. Then, when identifying the preprocessing, the worker W performs the preprocessing with a jig, using the stage 41a as a workbench. Then, the worker W delivers the preprocessed parts E to the parts supply device 11 that requires replenishment the parts E.

The remaining structures of the first modified example of the first embodiment are similar to those of the first embodiment.

Second Modified Example of First Embodiment

A second modified example of the first embodiment is now described with reference to FIG. 15. In the second modified example of the first embodiment, an example is described in which a presentation device is provided on a jig placement portion, unlike the aforementioned first embodiment in which the presentation device is not provided on the jig placement portion. The same or similar structures as those of the first embodiment are denoted by the same reference numerals, and description thereof is omitted.

Figure 15:
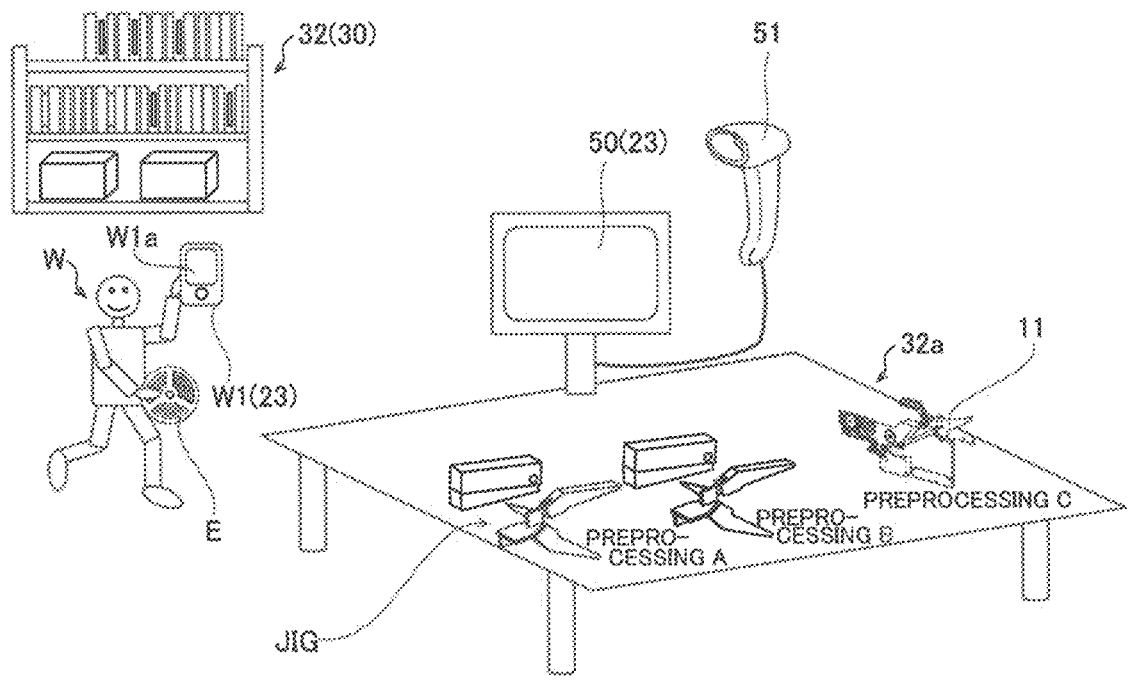
FIG. 15 is a diagram for illustrating presentation of preprocessing identification information in a case in which a parts storage is a storage shelf according to a second modified example of the first embodiment.

As shown in FIG. 15, a display device 50 that is a presentation device 23 is provided on a jig placement portion 32a according to the second modified example of the first embodiment of the present disclosure. The display device 50 is configured to display information. The display device 50 includes a liquid crystal monitor, for example. Furthermore, the display device 50 includes a reader 51 to read identification information R1 (see FIG. 3A) for identifying parts E. The reader 51 is a barcode reader, for example. When the identification information R1 is read by the reader 51, the display device 50 displays preprocessing identification information on the parts E from which the identification information R1 has been read. Information as shown in FIGS. 8A and 8B is displayed on the display device 50, for example.

In an example shown in FIG. 15, first, a worker W unloads the parts E to be replenished from a storage shelf 32 of a storage 30 based on an unloading instruction by an instruction device 22. Then, the parts E are delivered to the jig placement portion 32a to place a jig for preprocessing on the parts E. When the parts E are delivered to the jig placement portion 32a, the worker W reads the identification information R1 with the reader 51 to display the preprocessing identification information on the parts E on the display device 50 and identify the preprocessing based on the preprocessing identification information (characters) displayed on the display device 50. Then, the worker W performs the preprocessing with the jig placed on the jig placement portion 32a, using the jig placement portion 32a as a workbench. Then, the worker W delivers the preprocessed parts E to a parts supply device 11 that requires replenishment of the parts E.

The remaining structures of the second modified example of the first embodiment are similar to those of the first embodiment.

Second Embodiment

A second embodiment is now described with reference to FIGS. 1 and 16 to 18. In this second embodiment, an example is described in which in addition to the first embodiment, parts are sorted by delivery destination. The same or similar structures as those of the first embodiment are denoted by the same reference numerals, and description thereof is omitted.

(Structure of Parts Mounting System)

Figure 16:
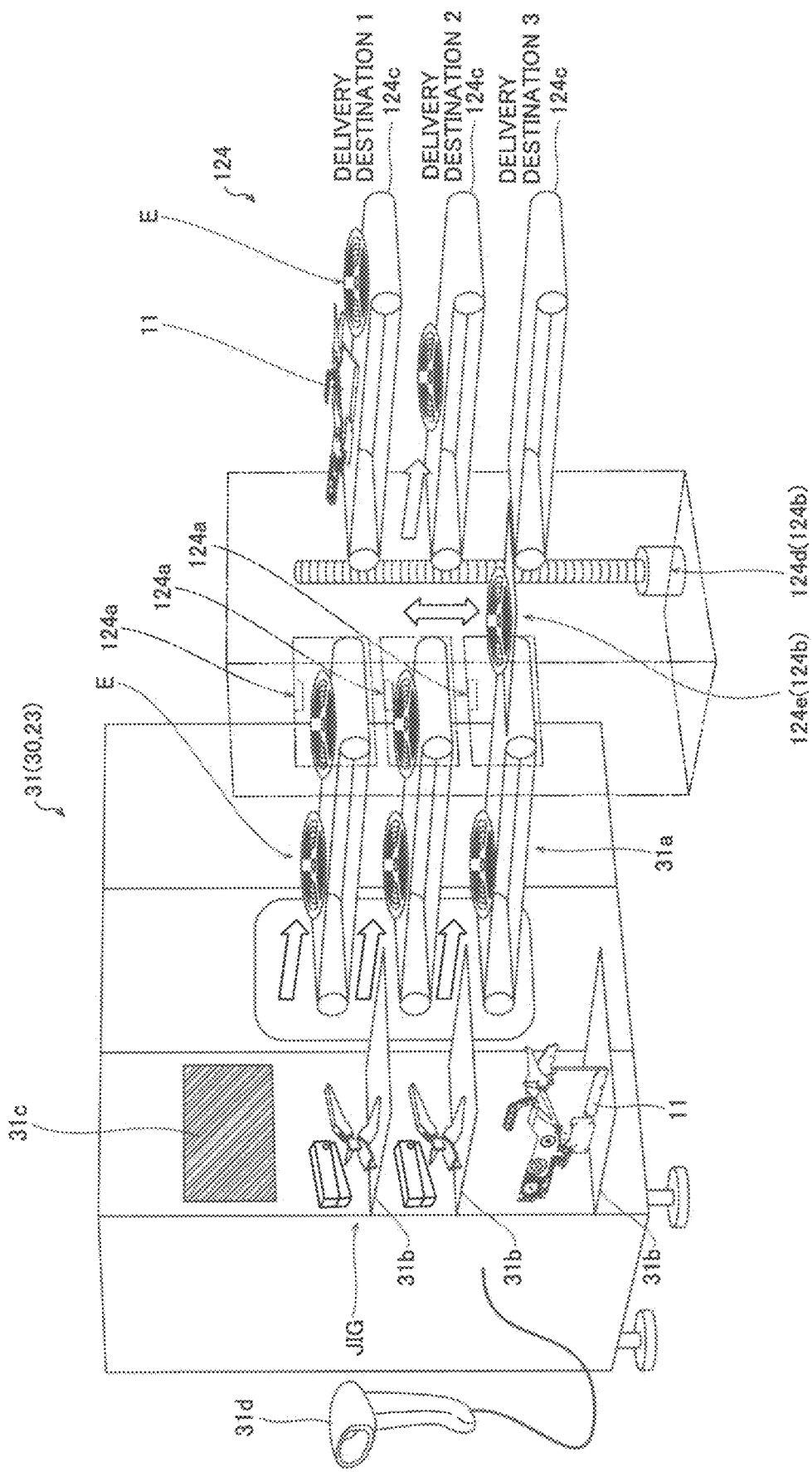
FIG. 16 is a diagram for illustrating presentation of preprocessing identification information and parts sorting by delivery destination in a case in which a parts storage is a storage device according to a second embodiment.

As shown in FIG. 1, a parts mounting system 200 according to the second embodiment of the present disclosure is different from the parts mounting system 100 according to the first embodiment in that the parts mounting system 200 includes a parts replenishment system 120. Furthermore, as shown in FIGS. 1 and 16, the parts replenishment system 120 is different from the parts replenishment system 20 according to the first embodiment in that the parts replenishment system 120 includes an instruction device 122 and a sorting device 124. Moreover, the instruction device 122 is different from the instruction device 22 according to the first embodiment in that the instruction device 122 includes a controller 122b.

In the second embodiment, as shown in FIG. 16, the controller 122b of the instruction device 122 is configured to issue a sorting instruction so as to sort a plurality of parts E to be unloaded by delivery destination when the plurality of parts E are unloaded. The sorting of the parts E by delivery destination refers to sorting of the parts E by mounting line 10 or sorting of the parts E by delivery order, for example. The controller 122b of the instruction device 122 is configured to perform a control to transmit the sorting instruction to the sorting device 124 and a mobile terminal W1 via a communicator 22a.

The sorting device 124 is a device that automatically sorts the parts E. The sorting device 124 is provided so as to receive the parts E from stages 31a of a storage device 31 of a storage 30. The sorting device 124 is configured to sort the parts E received from the stages 31a of the storage device 31 of the storage 30 by delivery destination. Specifically, the sorting device 124 includes readers 124a, a sorter 124b, and stages 124c. The readers 124a are provided to read identification information R1 (see FIG. 3A) for identifying the parts E. The readers 124a are barcode readers, for example. The readers 124a are provided to read the identification information R1 on the parts E before the parts E are sorted by the sorter 124b.

The sorter 124b is provided to sort the parts E by delivery destination. The sorter 124b includes a drive mechanism 124d and an elevating stage 124e. The drive mechanism 124d is configured to move up and down the elevating stage 124e. The drive mechanism 124d is a ball screw shaft mechanism including a motor and a ball screw shaft. The elevating stage 124e is configured to receive the parts E from the stages 31a of the storage device 31 of the storage 30. Furthermore, the elevating stage 124e is configured to be moved up and down by the drive mechanism 124d in a state in which the elevating stage 124e has received the parts E. Moreover, the elevating stage 124e is configured to deliver the received parts E to the stages 124c. The stages 124c each include a belt conveyor capable of conveying the delivered parts E. A plurality of stages 124c are provided depending on delivery destinations.

The sorting device 124 is configured to sort the parts E by delivery destination by differentiating the stages 124c. The sorting device 124 is configured to sort the parts E into the corresponding stages 124c based on the sorting instruction by the instruction device 122. Specifically, the sorting device 124 is configured to perform a control to determine the stage 124c, which is a placement location after sorting, based on the identification information R1 on the parts E read by the readers 124a and replenishment destination information of the sorting instruction by the instruction device 122. Furthermore, the sorting device 124 is configured to perform a control to drive the elevating stage 124e of the sorter 124b so as to sort the parts E into the determined stage 124c.

In an example shown in FIG. 16, three stages 124c including a stage 124c for a delivery destination 1, a stage 124c for a delivery destination 2, and a stage 124c for a delivery destination 3 are provided. The delivery destinations 1 to 3 are different from each other, and are three mounting lines 10, respectively, for example. The parts E to be delivered to the delivery destination 1 are arranged on the stage 124c for the delivery destination 1. The parts E to be delivered to the delivery destination 1 are arranged on the stage 124c for the delivery destination 2. The parts E to be delivered to the delivery destination 3 are arranged on the stage 124c for the delivery destination 3.

Although detailed description is omitted, in the example shown in FIG. 16, first, a worker W performs preprocessing, using each of the stages 31a as a workbench similarly to the first embodiment. Then, the worker W delivers the preprocessed parts E to the sorting device 124. Then, the sorting device 124 sorts the parts E by delivery destination. Then, the worker W delivers the parts E sorted by delivery destination to a parts supply device 11 that requires replenishment.

Figure 17:
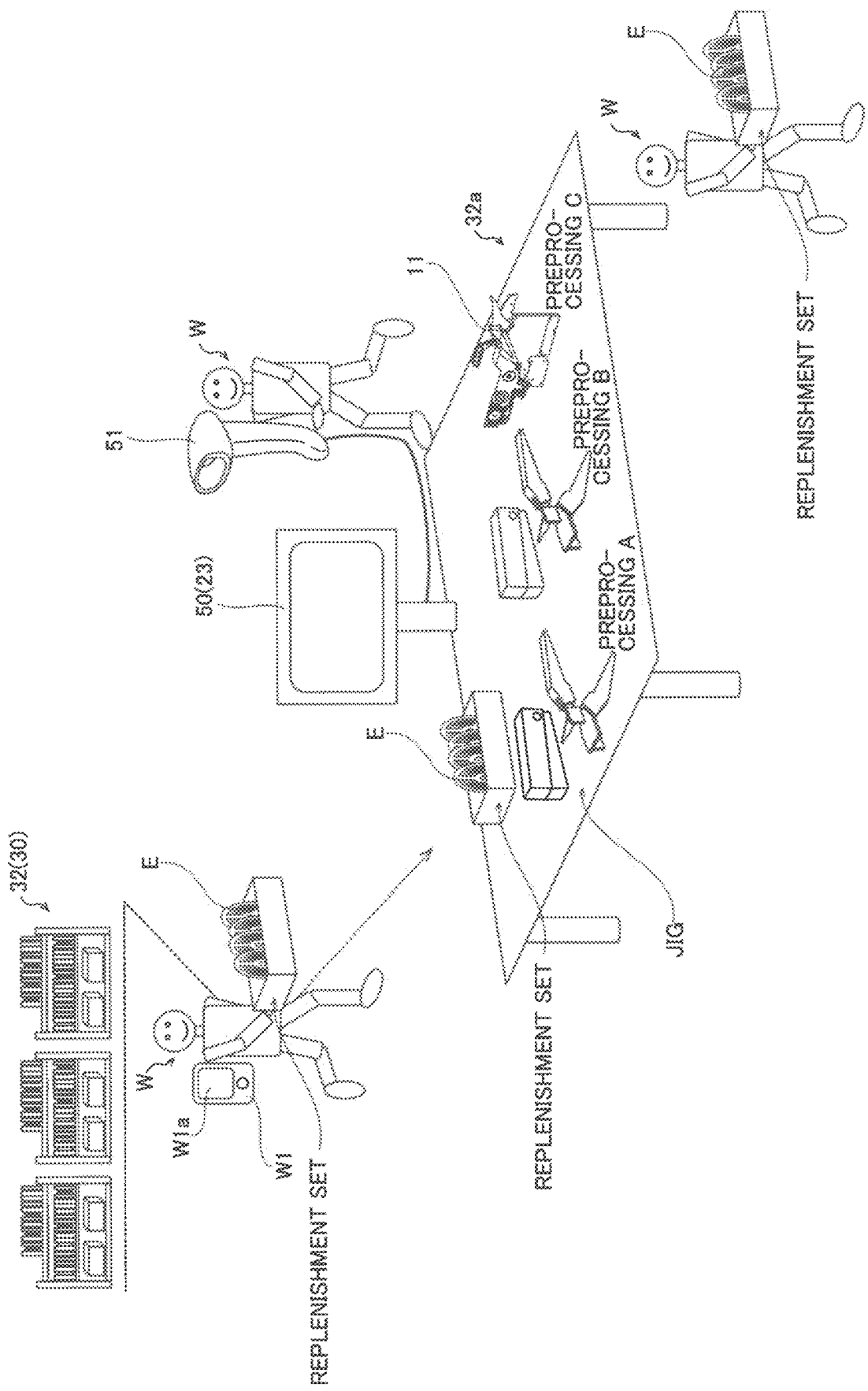
FIG. 17 is a diagram for illustrating presentation of the preprocessing identification information and parts sorting by delivery destination in a case in which the parts storage is a storage shelf according to a second embodiment.
Figure 18:
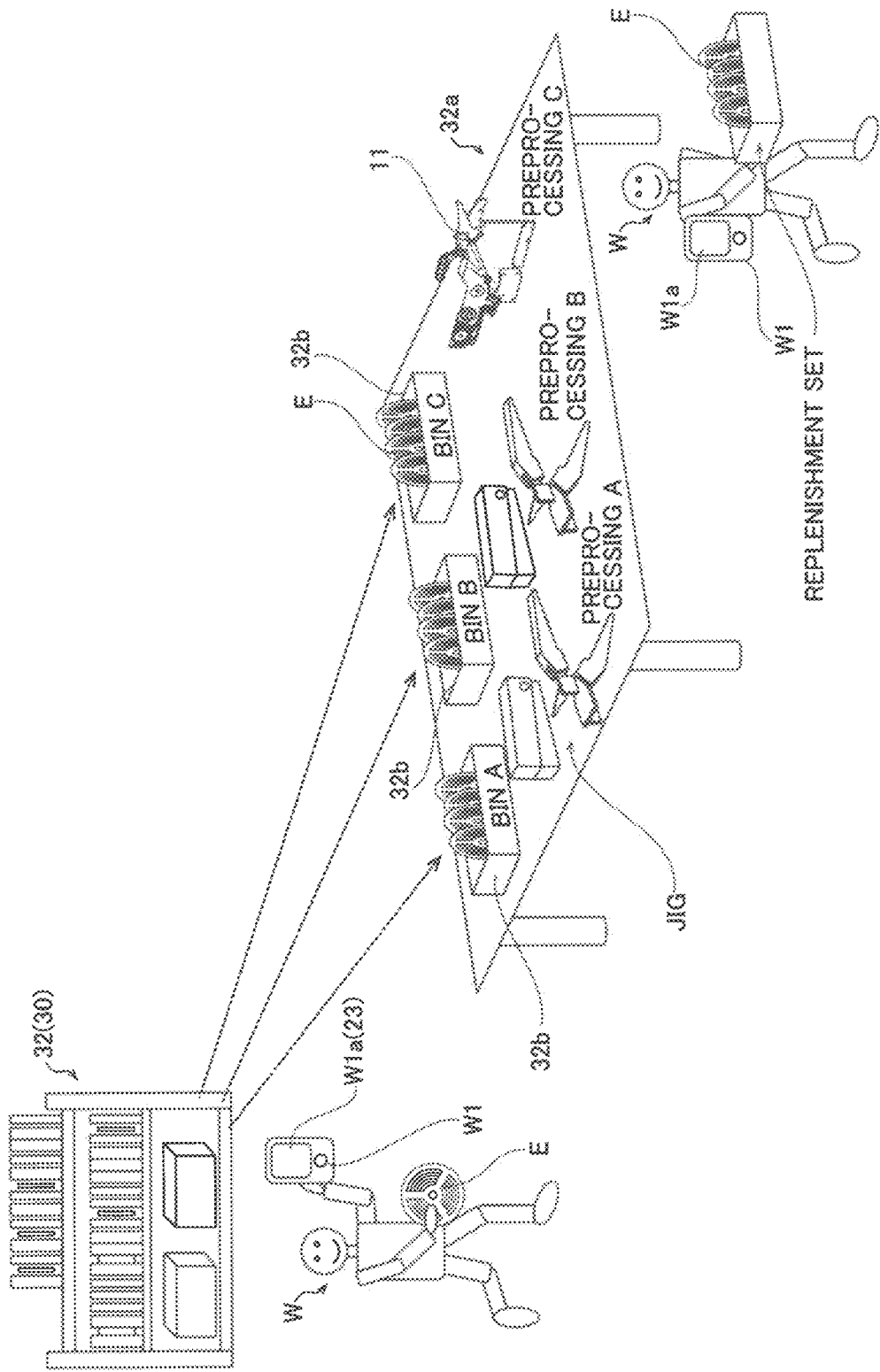
FIG. 18 is a diagram for illustrating presentation of the preprocessing identification information and parts sorting by delivery destination in a case in which the parts storage is a storage shelf according to the second embodiment.

As shown in FIGS. 17 and 18, the mobile terminal W1 is configured to display the replenishment destination information of the sorting instruction by the instruction device 122. The worker W can sort parts E by delivery destination based on the replenishment destination information.

In an example shown in FIG. 17, first, the worker W unloads the parts E to be replenished from a storage shelf 32 of the storage 30 so as to sort the parts E by delivery destination based on the replenishment destination information of the sorting instruction by the instruction device 122. For example, the worker W unloads the parts E so as to carry the parts E in one box for each delivery destination. Then, the worker W delivers the parts E to a jig placement portion 32a for placing a jig for the preprocessing on the parts E. Then, although detailed description is omitted, the worker W performs the preprocessing using the jig placement portion 32a as a workbench, similarly to the second modified example of the first embodiment. Then, the worker W collects the preprocessed parts E for each delivery destination, and then delivers the preprocessed parts E to the parts supply device 11 that requires replenishment.

In an example shown in FIG. 18, although detailed description is omitted, first, the worker W performs the preprocessing using the jig placement portion 32a as a workbench, similarly to the first embodiment. Then, the worker W sorts the parts E by delivery destination based on the replenishment destination information of the sorting instruction by the instruction device 122. For example, the worker W sorts the parts E so as to carry the parts E in one box for each delivery destination. Then, the worker W delivers the preprocessed parts E to the parts supply device 11 that requires replenishment in a state in which the preprocessed parts E are sorted by delivery destination.

The remaining structures of the second embodiment are similar to those of the first embodiment.

Advantageous Effects of Second Embodiment

According to the second embodiment, the following advantageous effects are achieved.

According to the second embodiment, as described above, the instruction device 122 is configured to issue the sorting instruction so as to sort the plurality of parts E to be unloaded by delivery destination when the plurality of parts E are unloaded. Accordingly, the plurality of parts E are sorted by delivery destination, and thus the parts E can be easily delivered to the parts supply device 11.

According to the second embodiment, as described above, the parts replenishment system 120 includes the sorting device 124 configured to sort the parts E. Accordingly, the sorting device 124 can automatically sort the parts E, and thus the worker W can be saved the trouble of sorting the parts E, unlike a case in which the worker W sorts the parts E.

The remaining advantageous effects of the second embodiment are similar to those of the first embodiment.

Third Embodiment

A third embodiment is now described with reference to FIGS. 1 and 19. In this third embodiment, an example is described in which one sorting device is provided for a plurality of storages, unlike the aforementioned second embodiment. The same or similar structures as those of the second embodiment are denoted by the same reference numerals, and description thereof is omitted.

(Structure of Parts Mounting System)

As shown in FIG. 1, a parts mounting system 300 according to the third embodiment of the present disclosure is different from the parts mounting system 200 according to the second embodiment in that the parts mounting system 300 includes a parts replenishment system 220. Furthermore, as shown in FIG. 19, the parts replenishment system 220 is different from the parts replenishment system 120 according to the second embodiment in that the parts replenishment system 220 includes a sorting device 224 and a stage 225.

In the third embodiment, as shown in FIG. 19, one stage 225 and one sorting device 224 are provided for a plurality of storages 30 (storage devices 31 and storage shelves 32). The stage 225 is a workbench for performing preprocessing. The stage 225 includes a belt conveyor capable of conveying parts E. A display device 250 that is a presentation device 23, is provided. The display device 250 is configured to display information. The display device 250 includes a liquid crystal monitor, for example. The display device 250 includes a reader 251 to read identification information R1 (see FIG. 3A) for identifying the parts E. The reader 251 is a barcode reader, for example. When the identification information R1 is read by the reader 251, the display device 250 displays preprocessing identification information on the parts E from which the identification information R1 has been read. Information as shown in FIGS. 8A and 8B is displayed on the display device 250, for example. The sorting device 224 has the same structure as the sorting device 124 according to the second embodiment, except that the sorting device 224 is provided so as to receive the parts E from the stage 225.

In an example shown in FIG. 19, first, a worker W unloads the parts E to be replenished from the storage devices 31 and the storage shelves 32 of the storages 30 based on an unloading instruction by an instruction device 122. Then, the parts E are delivered to the stage 225. When the parts E are delivered to the stage 225, the worker W reads the identification information R1 with the reader 251 to display the preprocessing identification information on the parts E on the display device 250 and identify preprocessing based on the preprocessing identification information (characters) displayed on the display device 250. Then, the worker W performs the preprocessing with a jig, using the stage 225 as a workbench. Then, the worker W delivers the preprocessed parts E to the sorting device 224. Then, the sorting device 224 sorts the parts E by delivery destination. Then, the worker W delivers the parts E sorted by delivery destination to a parts supply device 11 that requires replenishment.

The remaining structures of the third embodiment are similar to those of the first embodiment.

Advantageous Effects of Third Embodiment

According to the third embodiment, the following advantageous effects are achieved.

According to the third embodiment, as described above, one stage 225 and one sorting device 224 are provided for the plurality of storages 30 (the storage devices 31 and the storage shelves 32). Accordingly, the number of preprocessing locations (stage 225) and the number of sorting devices 224 can be reduced, and thus a preprocessing location (stage 225) and the sorting device 224 can be easily provided in the factory.

The remaining advantageous effects of the third embodiment are similar to those of the first embodiment.

Fourth Embodiment

A fourth embodiment is now described with reference to FIGS. 1 and 20. In this fourth embodiment, an example is described in which a sorting auxiliary device is provided instead of the sorting device, unlike the aforementioned second embodiment. The same or similar structures as those of the second embodiment are denoted by the same reference numerals, and description thereof is omitted.
(Structure of Parts Mounting System)

As shown in FIG. 1, a parts mounting system 400 according to the fourth embodiment of the present disclosure is different from the parts mounting system 200 according to the second embodiment in that the parts mounting system 400 includes a parts replenishment system 320. Furthermore, as shown in FIG. 20, the parts replenishment system 320 is different from the parts replenishment system 120 according to the second embodiment in that the parts replenishment system 320 includes a sorting auxiliary device 326. A storage device of a storage has the structure of the storage device 41 of the storage 40 according to the first modified example of the first embodiment.

In the fourth embodiment, as shown in FIG. 20, the sorting auxiliary device 326 is a device that assists to sort parts E by delivery destination by presenting information indicating the delivery destination of the parts E. The sorting auxiliary device 326 includes lamps 326a and a lamp controller 326b. The lamps 326a are configured to be turned on and off. A plurality of lamps 326a are provided depending on delivery destinations. In front of the lamps 326a, sorting boxes 326c for sorting the parts E according to the delivery destination are arranged. The lamp controller 326b includes a processor such as a CPU, a memory, etc., and controls the lamps 326a to be turned on and off.

The lamp controller 326b of the sorting auxiliary device 326 is configured to perform a control to assist to sort the parts E by delivery destination by turning on the corresponding lamp 326a based on a sorting instruction by an instruction device 122. Specifically, the lamp controller 326b of the sorting auxiliary device 326 is configured to determine the lamp 326a to be turned on and control the lamp 326a to be turned on based on identification information R1 on the parts E read by a reader 31d of the storage device 41 of the storage 40 and the replenishment destination information of the sorting instruction by the instruction device 122.

In an example shown in FIG. 20, first, the parts E to be replenished are unloaded to a stage 41a of the storage device 41 of the storage 40 based on an unloading instruction by the instruction device 122. Then, a worker W reads the identification information R1 with the reader 31d to display preprocessing identification information on the parts E on a display 41b and identify preprocessing based on the preprocessing identification information (characters) displayed on the display 41b. Then, when identifying the preprocessing, the worker W performs the preprocessing with a jig, using the stage 41a as a workbench. Furthermore, the corresponding lamp 326a is turned on based on the identification information R1 read by the reader 31d. Then, the worker W sorts the preprocessed parts E into the sorting box 326c in front of the turned-on lamp 326a. The worker W performs these operations for the parts E to be unloaded. Then, the worker W delivers the preprocessed parts E sorted by delivery destination to a parts supply device 11 that requires replenishment of the parts E.

The remaining structures of the fourth embodiment are similar to those of the first embodiment.

Advantageous Effects of Fourth Embodiment

According to the fourth embodiment, the following advantageous effects are achieved.

According to the fourth embodiment, as described above, the parts replenishment system 320 includes the sorting auxiliary device 326 to assist to sort the parts E by delivery destination by presenting the information indicating the delivery destination of the parts E. Accordingly, even when the worker W perform sorting, the sorting operation can be easily performed by the sorting auxiliary device 326, and thus the burden required for the sorting operation can be reduced.

The remaining advantageous effects of the fourth embodiment are similar to those of the first embodiment.

MODIFIED EXAMPLES

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

For example, in the present disclosure, among the structures described in the first to fourth embodiments, the structures applicable to each other may be combined.

While the example in which the worker performs the preprocessing on the packaging material for the parts has been shown in each of the aforementioned first to fourth embodiments, the present disclosure is not restricted to this. In the present disclosure, an automatic preprocessing device that performs the preprocessing on the packaging material for the parts may perform the preprocessing on the packaging material for the parts. In this case, the storage device of the storage may be the automatic preprocessing device.

While the example in which the worker delivers the parts to the parts supply device has been shown in each of the aforementioned first to fourth embodiments, the present disclosure is not restricted to this. In the present disclosure, an automated delivery device that delivers the parts to the parts supply device may deliver the parts to the parts supply device. In this case, an automatic guided vehicle (AGV) may be the automatic delivery device.

While the example in which the packaging material for the parts is a tape member has been shown in each of the first to fourth aforementioned embodiments, the present disclosure is not restricted to this. In the present disclosure, the packaging material for the parts may be other than a tape member. For example, the packaging material for the parts may be a tray that holds tray parts.

While the example in which the preprocessing is preprocessing on the leader of the tape member that is the packaging material for the parts has been shown in each of the first to fourth aforementioned embodiments, the present disclosure is not restricted to this. In the present disclosure, the preprocessing may be preprocessing other than the preprocessing on the leader of the tape member that is the packaging material for the parts.

While the example in which the data aggregation device and the instruction device are provided independently of each other has been shown in each of the first to fourth aforementioned embodiments, the present disclosure is not restricted to this. In the present disclosure, the data aggregation device and the instruction device may be provided integrally.

While the example in which the presentation device is configured to present the information on attachment of the parts supply device in addition to the preprocessing identification information has been shown in each of the first to fourth aforementioned embodiments, the present disclosure is not restricted to this. In the present disclosure, the presentation device may not be necessarily configured to present the information on attachment of the parts supply device.

What is claimed is:

1. A parts replenishment system configured to replenish a parts supply device attached to a parts mounting device with parts, the parts replenishment system comprising:
    an instruction device configured to issue an instruction to unload the parts from a storage; and
    a presentation device configured to present preprocessing identification information for identifying preprocessing, the preprocessing being performed, before replenishment of the parts supply device with the parts, on a packaging material for the parts for which the unloading instruction has been issued by the instruction device,
    wherein the preprocessing identification information includes a type of jig used for performing the preprocessing performed before the replenishment of the parts supply device with the parts on the packaging material,
    wherein the packaging material for the parts is a tape member, and
    wherein the preprocessing includes at least one of the following:
        a process of cutting a starting end side of the tape member by a cutting jig as the jig, and
        a process of clamping the starting end side of the tape member by a clamp jig as the jig.

2. The parts replenishment system according to claim 1, wherein
    the presentation device includes a display device; and
    the display device is configured to present the preprocessing identification information by displaying the preprocessing identification information.

3. The parts replenishment system according to claim 2, wherein the display device is configured to display information indicating a method for the preprocessing, information indicating a type of the parts supply device, or information indicating an unloading destination of the parts for performing the preprocessing as the preprocessing identification information.

4. The parts replenishment system according to claim 1, wherein
    the presentation device includes the storage;
    the storage includes a plurality of stages to which the parts are unloaded to perform the preprocessing; and
    the storage is configured to present the preprocessing identification information by differentiating the stages, which are unloading destinations of the parts, according to the preprocessing.

5. The parts replenishment system according to claim 1, wherein the system determines a content of the preprocessing based on a specification of the parts supply device, which is a replenishment destination of the parts for which the unloading instruction has been issued, and a packaging specification of the parts for which the unloading instruction has been issued.

6. The parts replenishment system according to claim 1, wherein the instruction device is configured to issue a sorting instruction so as to sort a plurality of the parts to be unloaded by delivery destination in response to the instruction to unload the plurality of the parts.

7. The parts replenishment system according to claim 6, further comprising:
    a sorting device configured to sort the parts.

8. The parts replenishment system according to claim 1, wherein the presentation device is configured to determine whether the parts supply device supposed to be attached to the parts mounting device is attached and to present, in addition to the preprocessing identification information, information on attachment of the parts supply device to the parts mounting device in response to the determination that the parts supply device supposed to be attached to the parts mounting device is not attached.

9. The parts replenishment system according to claim 1, wherein the system is configured to memorize that the preprocessing has been executed in association with the parts on which the preprocessing has been executed.

10. The parts replenishment system according to claim 1, comprising the storage configured to store the parts covered by the packaging material.

11. The parts replenishment system according to claim 10, wherein the preprocessing is performed on a leader of the tape member that is provided at a starting end side of the tape member without the parts.

12. The parts replenishment system according to claim 2, wherein
    the presentation device includes the storage;
    the storage includes a plurality of stages to which the parts are unloaded to perform the preprocessing; and
    the storage is configured to present the preprocessing identification information by differentiating the stages, which are unloading destinations of the parts, according to the preprocessing.

13. The parts replenishment system according to claim 3, wherein
    the presentation device includes the storage;
    the storage includes a plurality of stages to which the parts are unloaded to perform the preprocessing; and
    the storage is configured to present the preprocessing identification information by differentiating the stages, which are unloading destinations of the parts, according to the preprocessing.

14. The parts replenishment system according to claim 2, wherein the system determines a content of the preprocessing based on a specification of the parts supply device, which is a replenishment destination of the parts for which the unloading instruction has been issued, and a packaging specification of the parts for which the unloading instruction has been issued.

15. The parts replenishment system according to claim 2, wherein the instruction device is configured to issue a sorting instruction so as to sort a plurality of the parts to be unloaded by delivery destination in response to the instruction to unload the plurality of the parts.

16. The parts replenishment system according to claim 1, wherein the parts replenishment system further comprises a jig placement portion that is placed in a vicinity of the storage and that placed the jig.

17. The parts replenishment system according to claim 1, wherein the presentation device includes the storage, wherein the storage includes a plurality of jig placement portions extending out of the storage.

18. The parts replenishment system according to claim 17, wherein the storage includes a plurality of stages extending out of the storage, wherein at least one of the plurality of stages includes an entire belt conveyor.

* * * * *